(12) United States Patent
Shulman et al.

(10) Patent No.: US 10,998,023 B2
(45) Date of Patent: May 4, 2021

(54) ERROR CORRECTION CODING IN A DYNAMIC MEMORY MODULE

(71) Applicant: Mobileye Vision Technologies Ltd., Jerusalem (IL)

(72) Inventors: Boris Shulman, Holon (IL); Yosef Kreinin, Jerusalem (IL); Leonid Smolyansky, Zichron Ya'akov (IL)

(73) Assignee: Mobileye Vision Technologies Ltd., Jerusalem (IL)

( * ) Notice: Subject to any disclaimer, the term of this patent is extended or adjusted under 35 U.S.C. 154(b) by 0 days.

(21) Appl. No.: 16/530,133

(22) Filed: Aug. 2, 2019

(65) Prior Publication Data

US 2020/0043539 A1 Feb. 6, 2020

Related U.S. Application Data

(60) Provisional application No. 62/714,530, filed on Aug. 3, 2018.

(51) Int. Cl.
*G11C 29/00* (2006.01)
*G11C 11/16* (2006.01)
*G11C 11/408* (2006.01)
*G06F 13/16* (2006.01)
*G06F 11/10* (2006.01)

(52) U.S. Cl.
CPC ...... *G11C 11/1657* (2013.01); *G06F 11/1068* (2013.01); *G06F 13/1647* (2013.01); *G06F 13/1673* (2013.01); *G11C 11/4085* (2013.01)

(58) Field of Classification Search
CPC ............ G11C 11/1657; G11C 11/4085; G11C 11/1068; G06F 13/1673; G06F 13/1647
See application file for complete search history.

(56) References Cited

U.S. PATENT DOCUMENTS 7,117,421 B1 10/2006 Danilak
8,644,104 B2 2/2014 Perego
2008/0115039 A1* 5/2008 Bains .................. G06F 11/1044
714/763

(Continued)

FOREIGN PATENT DOCUMENTS

WO 2020026029 2/2020

OTHER PUBLICATIONS

"International Application Serial No. PCT IB2019 000882, Invitation to Pay Add'l Fees and Partial Search Report dated Dec. 13, 2019", 10 pgs.

(Continued)

*Primary Examiner* — Samir W Rizk

(74) *Attorney, Agent, or Firm* — Schwegman Lundberg & Woessner, P.A.

(57) ABSTRACT

A method for error correction and a system. The method may include opening a selected row of a memory bank out of multiple memory banks of a dynamic memory module; and while the selected row is open: (i) receiving selected data sub-blocks that are targeted to be written to the selected row, (ii) calculating selected error correction code sub-blocks that are related to the selected data sub-blocks, (iii) caching the selected error correction code sub-blocks in a cache memory that differs from the dynamic memory module and (iv) writing, to the selected row, the selected error correction code sub-blocks.

34 Claims, 17 Drawing Sheets

(56) References Cited

U.S. PATENT DOCUMENTS

2013/0290607 A1* 10/2013 Chang .................. G06F 9/3842
                                                      711/103
2016/0307620 A1* 10/2016 Chun .................. G11C 11/4096
2019/0370114 A1* 12/2019 Troia .................... G06F 11/073

OTHER PUBLICATIONS

"International Application Serial No. PCT IB2019 000882, International Search Report dated Feb. 7, 2020", 6 pgs.
"International Application Serial No. PCT IB2019 000882, Written Opinion dated Feb. 7, 2020", 8 pgs.

* cited by examiner

ERROR CORRECTION CODING IN A DYNAMIC MEMORY MODULE

CLAIM OF PRIORITY

This application claims the benefit of priority to U.S. Provisional Application Ser. No. 62/714,530, filed Aug. 3, 2018, which is incorporated herein by reference in its entirety.

BACKGROUND

Advanced driver assistance systems (ADAS), and autonomous vehicle (AV) systems use cameras and other sensors together with object classifiers, which are designed to detect specific objects in an environment of a vehicle navigating a road. Object classifiers are designed to detect predefined objects and are used within ADAS and AV systems to control the vehicle or alert a driver based on the type of object that is detected its location, etc.

ADAS and AV systems are required to process a significant amount of information (such as image pixels) in real time. This may involve accessing dynamic memory modules that store the information.

Dynamic memory modules may include multiple memory banks. The multiple memory banks may be arranged in groups of memory banks.

Some dynamic memory modules, such as fifth generation low power memory devices (LPDDR5), impose a significant time gap between consecutive accesses to the same group of memory banks.

There is a growing need to allow a high-throughput access to information stored in dynamic memory modules of ADAS and AV systems.

SUMMARY

The following detailed description refers to the accompanying drawings. Wherever possible, the same reference numbers are used in the drawings and the following description to refer to the same or similar parts. While several illustrative embodiments are described herein, modifications, adaptations and other implementations are possible. For example, substitutions, additions, or modifications may be made to the components illustrated in the drawings, and the illustrative methods described herein may be modified by substituting, reordering, removing, or adding steps to the disclosed methods. Accordingly, the following detailed description may be not limited to the disclosed embodiments and examples.

Disclosed embodiments provide systems and methods that can be used as part of or in combination with autonomous navigation/driving and/or driver assist technology features. Driver assist technology refers to any suitable technology to assist drivers in the navigation and/or control of their vehicles, such as FCW, LDW and TSR, as opposed to fully autonomous driving.

BRIEF DESCRIPTION OF THE DRAWINGS

The accompanying drawings, which are incorporated in and constitute part of this disclosure, illustrate various disclosed embodiments. In the drawings.

DETAILED DESCRIPTION

Before discussing in detail examples of features of the error correction coding and memory management of a dynamic memory module of a system that may provide a variety of features related to autonomous driving, semi-autonomous driving and/or driver assist technology.

The system may be arranged to process images of an environment ahead of a vehicle navigating a road for training a neural networks or deep learning algorithms to estimate a future path of a vehicle based on images or feature of the processing of images of an environment ahead of a vehicle navigating a road using a trained neural network to estimate a future path of the vehicle.

There may be provided various possible implementations and configurations of a vehicle mountable system that can be used for carrying out and implementing the methods according to examples of the presently disclosed subject matter. In some embodiments, various examples of the system can be mounted in a vehicle and can be operated while the vehicle is in motion. In some embodiments, the system can implement the methods according to examples of the presently disclosed subject matter.

However, it would be appreciated that embodiments of the present disclosure are not limited to scenarios where a suspected upright object indication is caused by a high-grade road. The suspected upright object indication can be associated with various other circumstances and can result from other types of image data and also from data that is not image based or is not exclusively image based, as well.

Figure 1:
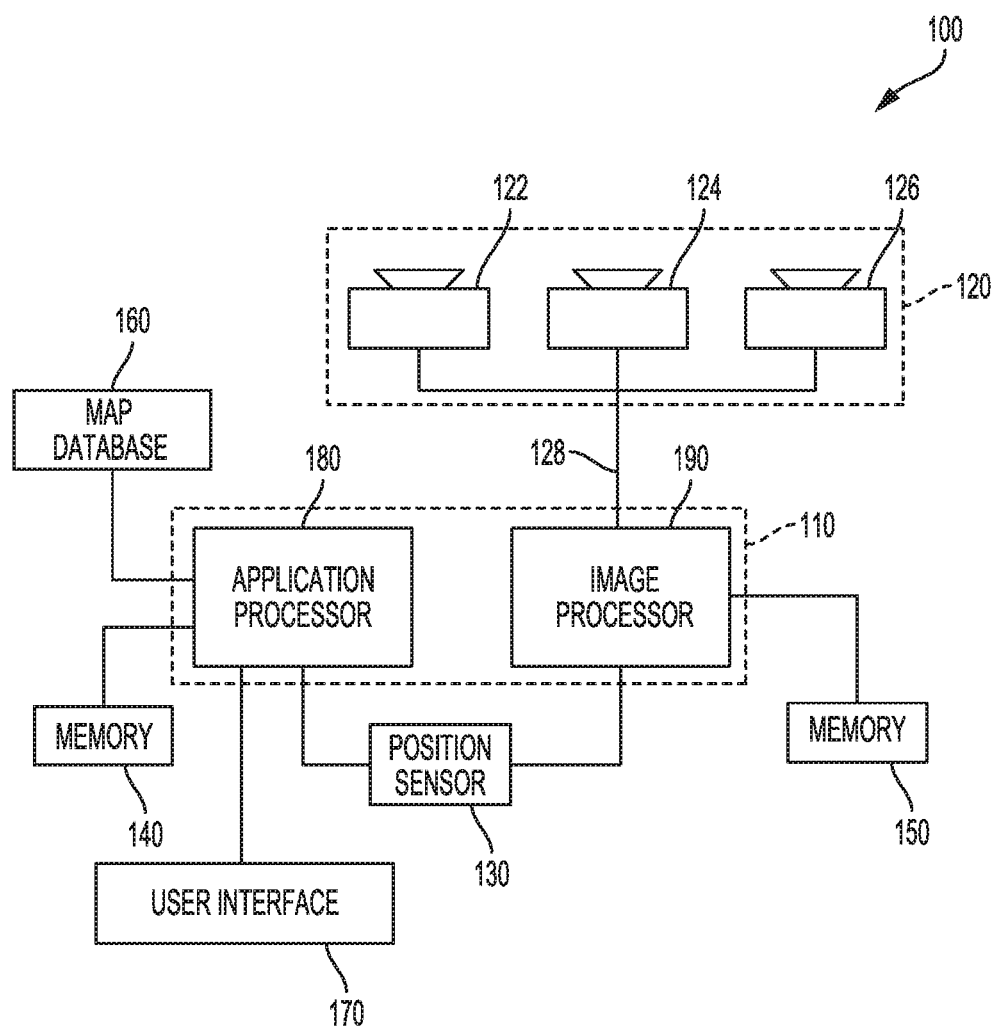
FIG. 1 is a block diagram representation of a system consistent with the disclosed embodiments.

FIG. 1, to which reference is now made, is a block diagram representation of a system consistent with the disclosed embodiments. System 100 can include various components depending on the requirements of a particular implementation. In some examples, system 100 can include a processing unit 110, an image acquisition device 120 and one or more memory units 140, 150. Processing unit 110 can include one or more processing devices. In some embodiments, processing unit 110 can include an application processor 180, an image processor 190, or any other suitable processing device. Similarly, image acquisition device 120 can include any number of image acquisition devices and components depending on the requirements of a particular application. In some embodiments, image acquisition device 120 can include one or more image capture devices (e.g., cameras), such as image capture device 122, image capture device 124, and image capture device 126. In some embodiments, system 100 can also include a data interface 128 communicatively connecting processing unit 110 to image acquisition device 120. For example, data interface 128 can include any wired and/or wireless link or links for transmitting image data acquired by image acquisition device 120 to processing unit 110.

Both application processor 180 and image processor 190 can include various types of processing devices. For example, either or both of application processor 180 and image processor 190 can include one or more microprocessors, preprocessors (such as image preprocessors), graphics processors, central processing units (CPUs), support circuits, digital signal processors, integrated circuits, memory, or any other types of devices suitable for running applications and for image processing and analysis. In some embodiments, application processor 180 and/or image processor 190 can include any type of single or multi-core processor, mobile device microcontroller, central processing unit, etc. Various processing devices can be used, including, for example, processors available from manufacturers such as Intel®, AMD®, etc. and can include various architectures (e.g., x86 processor, ARM®, etc.).

In some embodiments, application processor 180 and/or image processor 190 can include any of the EyeQ series of processor chips available from Mobileye®. These processor designs each include multiple processing units with local memory and instruction sets. Such processors may include video inputs for receiving image data from multiple image sensors and may also include video out capabilities. In one example, the EyeQ2® uses 90 nm-micron technology operating at 332 Mhz. The EyeQ2® architecture has two floating point, hyper-thread 32-bit RISC CPUs (MIPS32® 34K® cores), five Vision Computing Engines (VCE), three Vector Microcode Processors (VMP®), Denali 64-bit Mobile DDR Controller, 128-bit internal Sonics Interconnect, dual 16-hit Video input and 18-bit Video output controllers, 16 channels DMA and several peripherals. The MIPS34K CPU manages the five VCEs, three VMP™ and the DMA, the second MIPS34K CPU and the multi-channel DMA as well as the other peripherals. The five VCEs, three VMP® and the MIPS34K CPU can perform intensive vision computations required by multi-function bundle applications. In another example, the EyeQ3®, which is a third-generation processor and is six times more powerful that the EyeQ2®, may be used in the disclosed examples. In yet another example, the EyeQ4®, the fourth-generation processor, may be used in the disclosed examples.

While FIG. 1 depicts two separate processing devices included in processing unit 110, more or fewer processing devices can be used. For example, in some examples, a single processing device may be used to accomplish the tasks of application processor 180 and image processor 190. In other embodiments, these tasks can be performed by more than two processing devices.

Processing unit 110 can include various types of devices. For example, processing unit 110 may include various devices, such as a controller, an image preprocessor, a central processing unit (CPU), support circuits, digital signal processors, integrated circuits, memory, or any other types of devices for image processing and analysis. The image preprocessor can include a video processor for capturing, digitizing, and processing the imagery from the image sensors. The CPU can include any number of microcontrollers or microprocessors. The support circuits can be any number of circuits generally well known in the art, including cache, power supply, clock, and input-output circuits. The memory can store software that, when executed by the processor, controls the operation of the system. The memory can include databases and image processing software, including a trained system, such as a neural network, for example. The memory can include any number of random access memories, read only memories, flash memories, disk drives, optical storage, removable storage, and other types of storage. In one instance, the memory can be separate from the processing unit 110. In another instance, the memory can be integrated into the processing unit 110.

Each memory 140, 150 can include software instructions that when executed by a processor (e.g., application processor 180 and/or image processor 190), can control operation of various aspects of system 100. These memory units can include various databases and image processing software. The memory units can include random access memory, read only memory, flash memory, disk drives, optical storage, tape storage, removable storage, and/or any other types of storage. In some examples, memory units 140, 150 can be separate from the application processor 180 and/or image processor 190. In other embodiments, these memory units can be integrated into application processor 180 and/or image processor 190.

In some embodiments, the system can include a position sensor 130. The position sensor 130 can include any type of device suitable for determining a location associated with at least one component of system 100. In some embodiments, position sensor 130 can include a GPS receiver. Such receivers can determine a user position and velocity by processing signals broadcasted by global positioning system satellites. Position information from position sensor 130 can be made available to application processor 180 and/or image processor 190.

In some embodiments, the system 100 can be operatively connectible to various systems, devices and units onboard a vehicle in which the system 100 can be mounted, and through any suitable interfaces (e.g., a communication bus) the system 100 can communicate with the vehicle's systems. Examples of vehicle systems with which the system 100 can cooperate include: a throttling system, a braking system, and a steering system.

In some embodiments, the system 100 can include a user interface 170. User interface 170 can include any device suitable for providing information to or for receiving inputs from one or more users of system 100, including, for example, a touchscreen, microphone, keyboard, pointer devices, track wheels, cameras, knobs, buttons, etc. Information can be provided by the system 100, through the user interface 170, to the user.

In some embodiments, the system 100 can include a map database 160. The map database 160 can include any type of database for storing digital map data. In some examples, map database 160 can include data relating to a position, in a reference coordinate system, of various items, including roads, water features, geographic features, points of interest, etc. Map database 160 can store not only the locations of such items, but also descriptors relating to those items, including, for example, names associated with any of the stored features and other information about them. For example, locations and types of known obstacles can be included in the database, information about a topography of a road or a grade of certain points along a road, etc. In some embodiments, map database 160 can be physically located with other components of system 100. Alternatively or additionally, map database 160 or a portion thereof can be located remotely with respect to other components of system 100 (e.g., processing unit 110). In such embodiments, information from map database 160 can be downloaded over a wired or wireless data connection to a network (e.g., over a cellular network and/or the Internet, etc.

Image capture devices 122, 124, and 126 can each include any type of device suitable for capturing at least one image from an environment. Moreover, any number of image capture devices can be used to acquire images for input to the image processor. Some examples of the presently disclosed subject matter can include or can be implemented with only a single-image capture device, while other examples can include or can be implemented with two, three, or even four or more image capture devices. Image capture devices 122, 124, and 126 will be further described with reference to FIGS. 2B-2E, below.

It would be appreciated that the system 100 can include or can be operatively associated with other types of sensors, including for example: an acoustic sensor, a RF sensor (e.g., radar transceiver), a LIDAR sensor. Such sensors can be used independently of or in cooperation with the image acquisition device 120. For example, the data from the radar system (not shown) can be used for validating the processed information that is received from processing images acquired by the image acquisition device 120, e.g., to filter certain false positives resulting from processing images acquired by the image acquisition device 120, or it can be combined with or otherwise compliment the image data from the image acquisition device 120, or some processed variation or derivative of the image data from the image acquisition device 120.

Figure 2A:
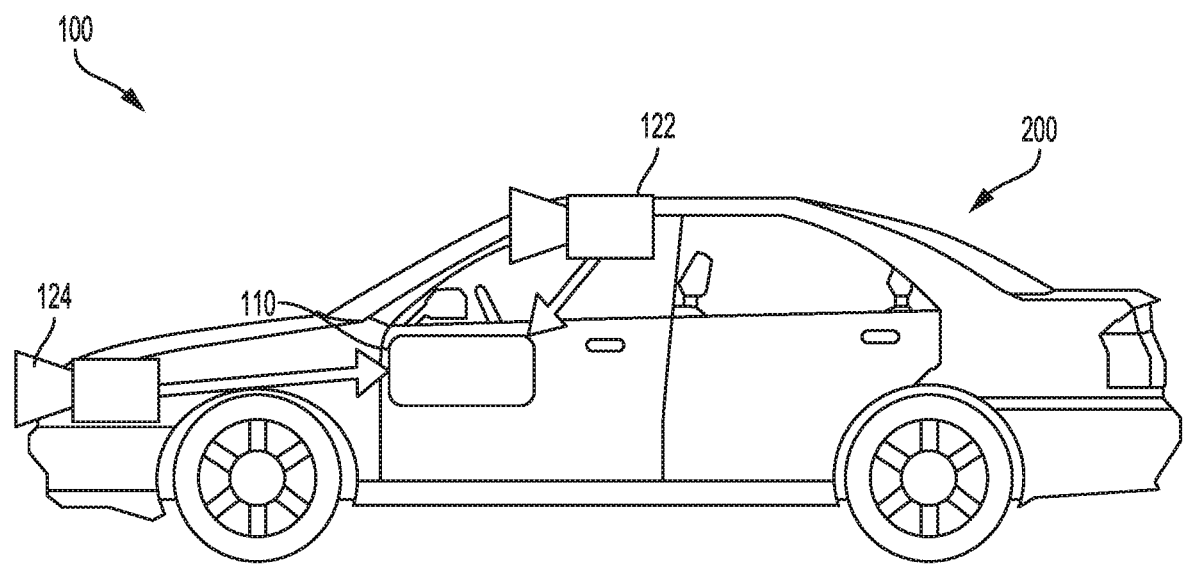
FIG. 2A is a diagrammatic side view representation of an exemplary vehicle including a system consistent with the disclosed embodiments.

System 100, or various components thereof, can be incorporated into various different platforms. In some embodiments, system 100 may be included on a vehicle 200, as shown in FIG. 2A. For example, vehicle 200 can be equipped with a processing unit 110 and any of the other components of system 100, as described above relative to FIG. 1. While in some embodiments vehicle 200 can be equipped with only a single-image capture device (e.g., camera), in other embodiments, such as those discussed in connection with FIGS. 2B-2E, multiple image capture devices can be used. For example, either of image capture devices 122 and 124 of vehicle 200, as shown in FIG. 2A, can be part of an ADAS (Advanced Driver Assistance Systems) imaging set.

The image capture devices included on vehicle 200 as part of the image acquisition device 120 can be positioned at any suitable location. In some embodiments, as shown in FIGS. 2A-2F, and 3A-3C, image capture device 122 can be located in the vicinity of the rearview mirror. This position may provide a line of sight similar to that of the driver of vehicle 200, which can aid in determining what is and is not visible to the driver.

Other locations for the image capture devices of image acquisition device 120 can also be used. For example, image capture device 124 can be located on or in a bumper of vehicle 200. Such a location can be especially suitable for image capture devices having a wide field of view. The line of sight of bumper-located image capture devices can be different from that of the driver. The image capture devices (e.g., image capture devices 122, 124, and 126) can also be located in other locations. For example, the image capture devices may be located on or in one or both of the side mirrors of vehicle 200, on the roof of vehicle 200, on the hood of vehicle 200, on the trunk of vehicle 200, on the sides of vehicle 200, mounted on, positioned behind, or positioned in front of any of the windows of vehicle 200, and mounted in or near light fixtures on the front and/or back of vehicle 200, etc. The image capture unit, or an image capture device that is one of a plurality of image capture devices that are used in an image capture unit, can have a field-of-view (FOV) that is different than the FOV of a driver of a vehicle, and not always see the same objects. In one example, the FOV of the image acquisition device 120 can extend beyond the FOV of a typical driver and can thus image objects which are outside the FOV of the driver. In yet another example, the FOV of the image acquisition device 120 is some portion of the FOV of the driver. In some embodiments, the FOV of the image acquisition device 120 corresponding to a sector which covers an area of a road ahead of a vehicle and possibly also surroundings of the road.

In addition to image capture devices, vehicle 200 can be include various other components of system 100. For example, processing unit 110 may be included on vehicle 200 either integrated with or separate from an engine control unit (ECU) of the vehicle. Vehicle 200 may also be equipped with a position sensor 130, such as a GPS receiver and may also include a map database 160 and memory units 140 and 150.

Figure 2B:
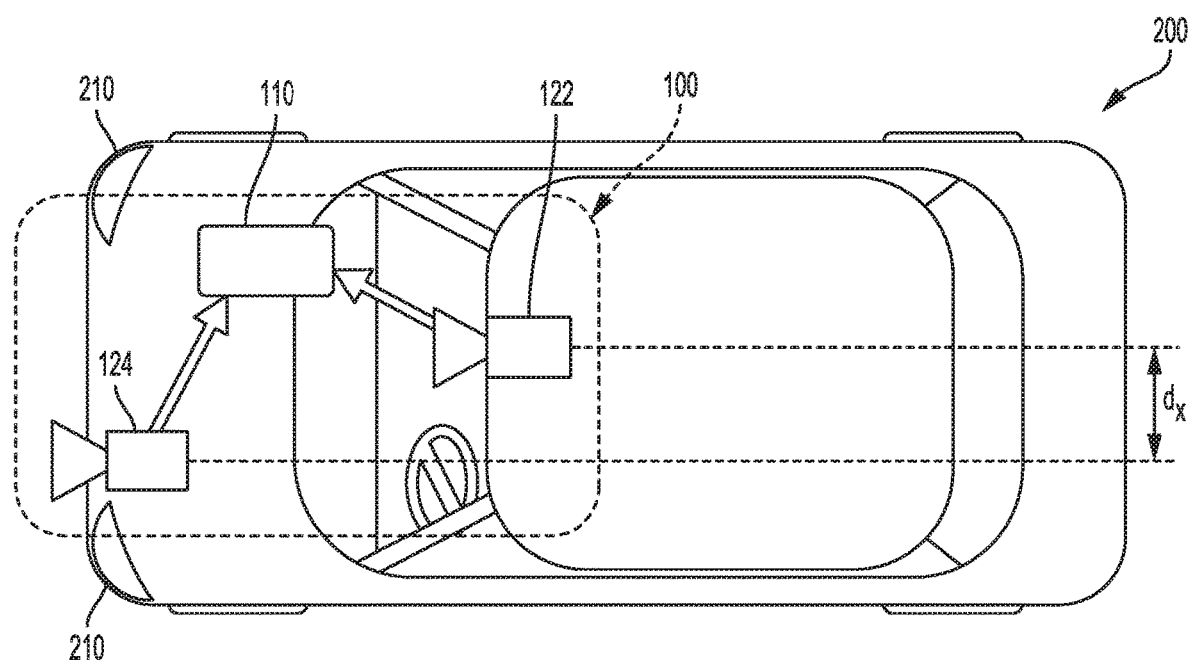
FIG. 2B is a diagrammatic top view representation of the vehicle and system shown in FIG. 2A consistent with the disclosed embodiments.

FIG. 2A is a diagrammatic side view representation of a vehicle imaging system according to examples of the presently disclosed subject matter. FIG. 2B is a diagrammatic top view illustration of the example shown in FIG. 2A. As illustrated in FIG. 2B, the disclosed examples can include a vehicle 200 including in its body a system 100 with a first image capture device 122 positioned in the vicinity of the rearview mirror and/or near the driver of vehicle 200, a second image capture device 124 positioned on or in a bumper region (e.g., one of bumper regions 210) of vehicle 200, and a processing unit 110.

Figure 2C:
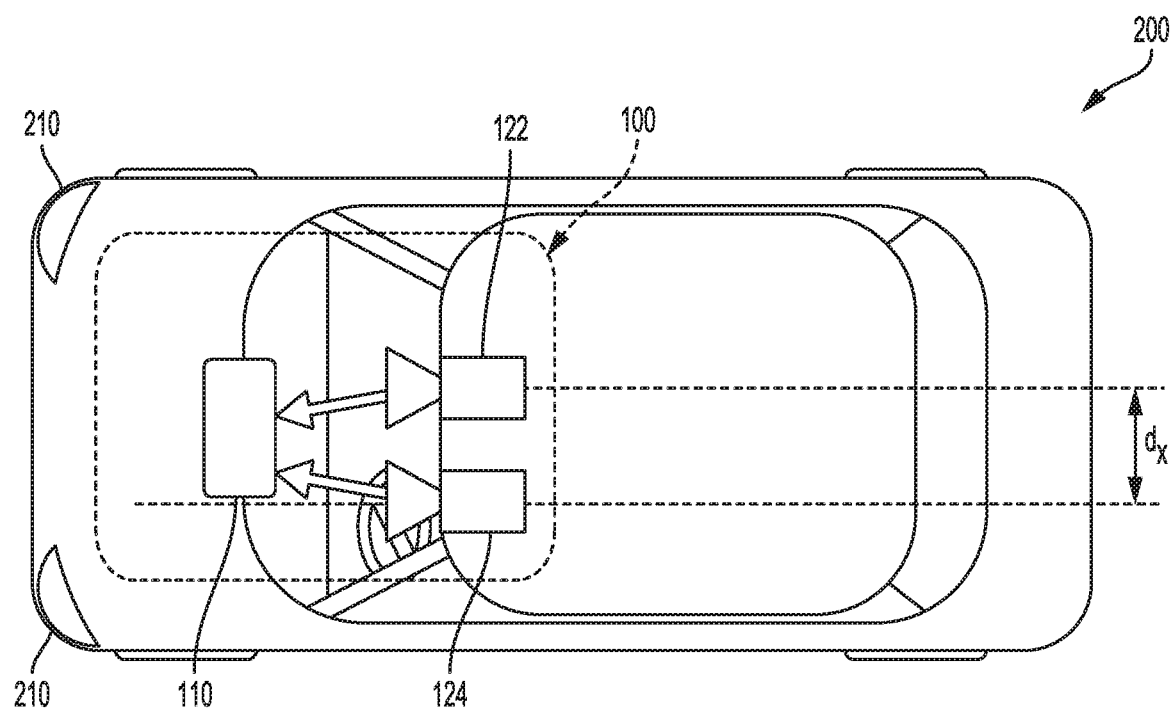
FIG. 2C is a diagrammatic top view representation of another embodiment of a vehicle including a system consistent with the disclosed embodiments.

As illustrated in FIG. 2C, image capture devices 122 and 124 may both be positioned in the vicinity of the rearview mirror and/or near the driver of vehicle 200. Additionally, while two image capture devices 122 and 124 are shown in FIGS. 2B and 2C, it should be understood that other embodiments may include more than two image capture devices. For example, in the embodiment shown in FIG. 2D, first, second, and third image capture devices 122, 124, and 126, are included in the system 100 of vehicle 200.

Figure 2D:
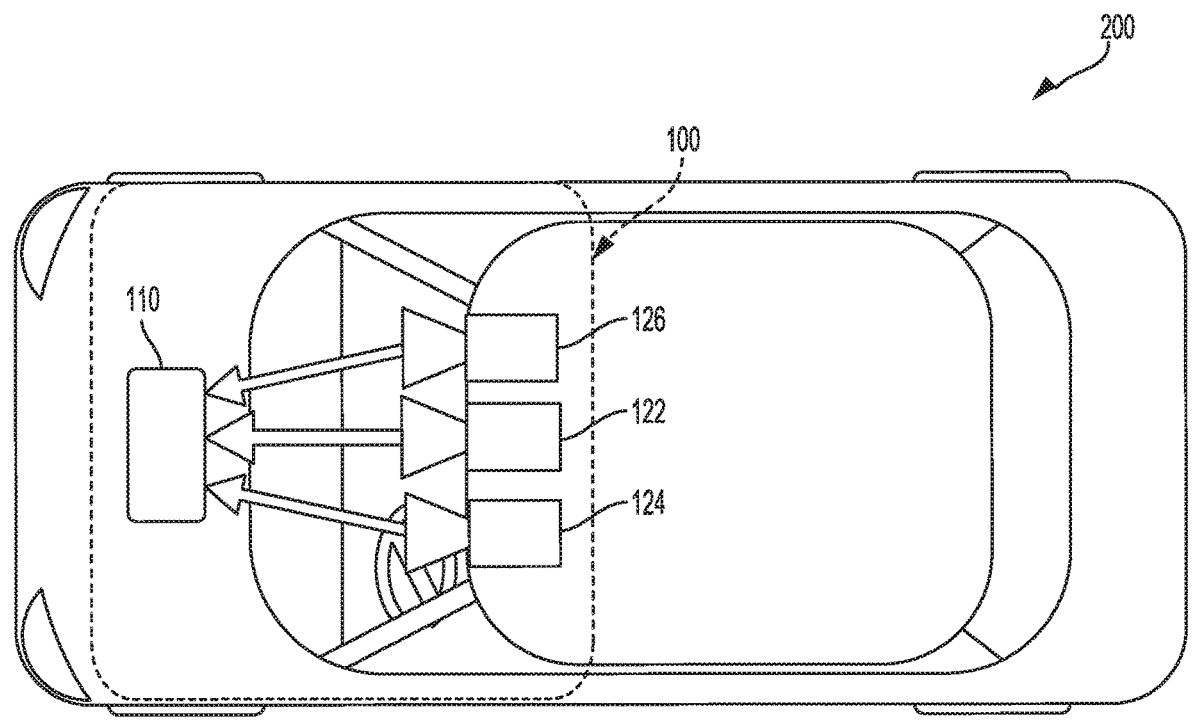
FIG. 2D is a diagrammatic top view representation of yet another embodiment of a vehicle including a system consistent with the disclosed embodiments.

As shown in FIG. 2D, image capture devices 122, 124, and 126 may be positioned in the vicinity of the rearview mirror and/or near the driver seat of vehicle 200. The disclosed examples are not limited to any particular number and configuration of the image capture devices, and the image capture devices may be positioned in any appropriate location within and/or on vehicle 200.

It is also to be understood that disclosed embodiments are not limited to a particular type of vehicle 200 and may be applicable to all types of vehicles including automobiles, trucks, trailers, motorcycles, bicycles, self-balancing transport devices and other types of vehicles.

The first image capture device 122 can include any suitable type of image capture device. Image capture device 122 can include an optical axis. In one instance, the image capture device 122 can include an Aptina M9V024 WVGA sensor with a global shutter. In another example, a rolling shutter sensor can be used. Image acquisition device 120, and any image capture device which is implemented as part of the image acquisition device 120, can have any desired image resolution. For example, image capture device 122 can provide a resolution of 1280×960 pixels and can include a rolling shutter.

Image acquisition device 120, and any image capture device which is implemented as part of the image acquisition device 120, can include various optical elements. In some embodiments one or more lenses can be included, for example, to provide a desired focal length and field of view for the image acquisition device 120, and for any image capture device which is implemented as part of the image acquisition device 120. In some examples, an image capture device which is implemented as part of the image acquisition device 120 can include or be associated with any optical elements, such as a 6 mm lens or a 12 mm lens, for example. In some examples, image capture device 122 can be arranged to capture images having a desired (and known) field-of-view (FOV).

The first image capture device 122 may have a scan rate associated with acquisition of each of the first series of image scan lines. The scan rate may refer to a rate at which an image sensor can acquire image data associated with each pixel included in a particular scan line.

Figure 2E:
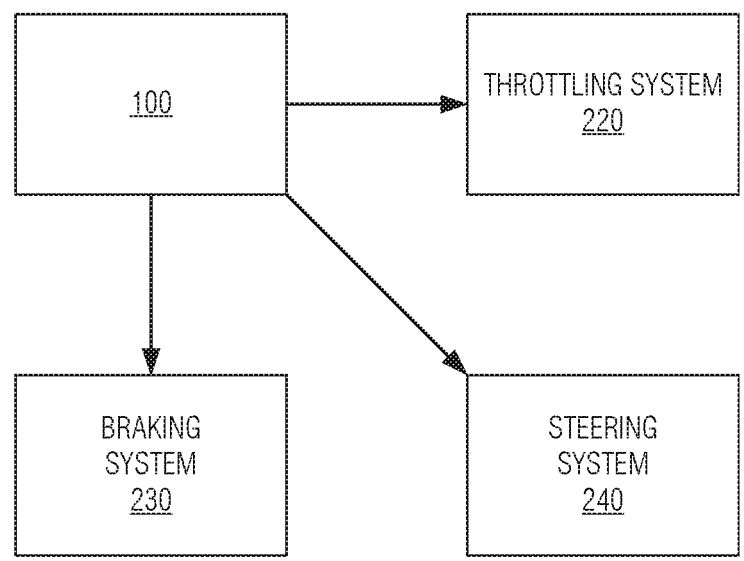
FIG. 2E is a diagrammatic representation of exemplary vehicle control systems consistent with the disclosed embodiments.

FIG. 2E is a diagrammatic representation of vehicle control systems, according to examples of the presently disclosed subject matter. As indicated in FIG. 2E, vehicle 200 can include throttling system 220, braking system 230, and steering system 240. System 100 can provide inputs (e.g., control signals) to one or more of throttling system 220, braking system 230, and steering system 240 over one or more data links (e.g., any wired and/or wireless link or links for transmitting data). For example, based on analysis of images acquired by image capture devices 122, 124, and/or 126, system 100 can provide control signals to one or more of throttling system 220, braking system 230, and steering system 240 to navigate vehicle 200 (e.g., by causing an acceleration, a turn, a lane shift, etc.). Further, system 100 can receive inputs from one or more of throttling system 220, braking system 230, and steering system 240 indicating operating conditions of vehicle 200 (e.g., speed, whether vehicle 200 is braking and/or turning, etc.).

Figure 3:
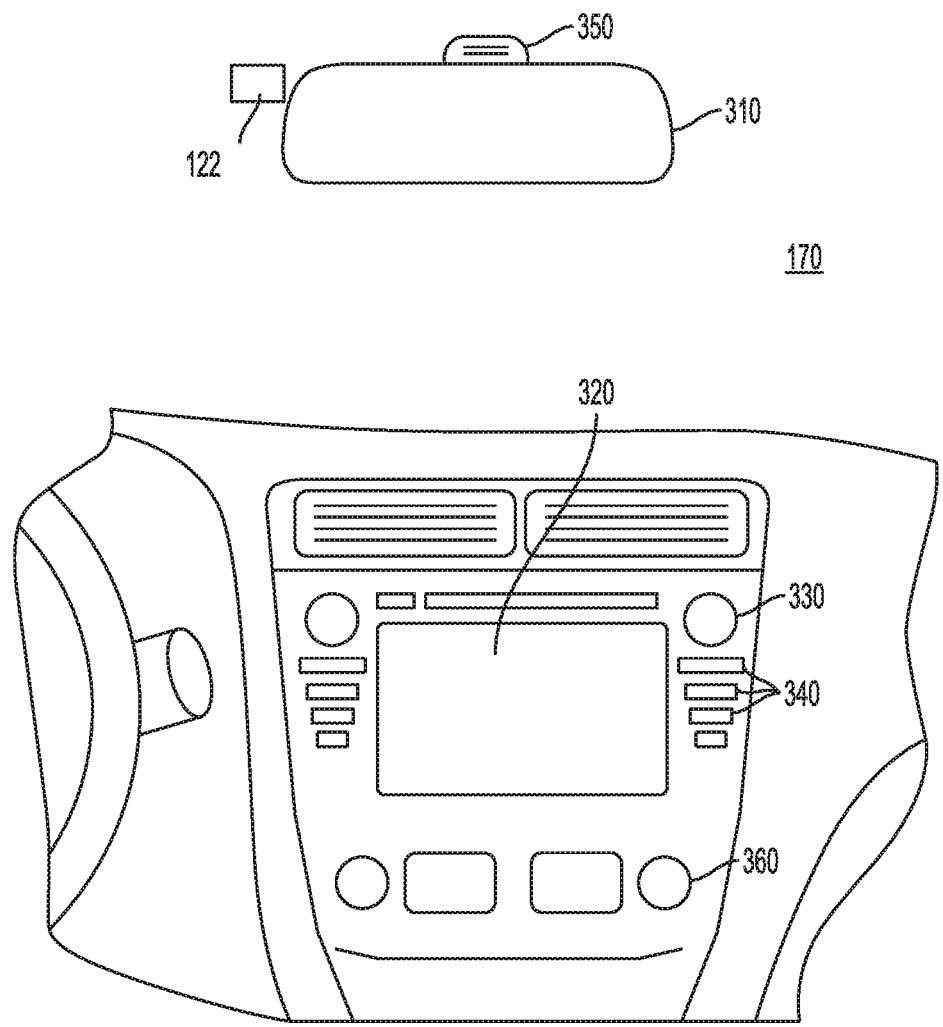
FIG. 3 is a diagrammatic representation of an interior of a vehicle including a rearview mirror and a user interface for a vehicle imaging system consistent with the disclosed embodiments.

As shown in FIG. 3, vehicle 200 may also include a user interface 170 for interacting with a driver or a passenger of vehicle 200. For example, user interface 170 in a vehicle application may include a touch screen 320, knobs 330, buttons 340, and a microphone 350. A driver or passenger of vehicle 200 may also use handles (e.g., located on or near the steering column of vehicle 200 including, for example, turn signal handles), buttons (e.g., located on the steering wheel of vehicle 200), and the like, to interact with system 100. In some embodiments, microphone 350 may be positioned adjacent to a rearview mirror 310. Similarly, in some embodiments, image capture device 122 may be located near rearview mirror 310. In some embodiments, user interface 170 may also include one or more speakers 360 (e.g., speakers of a vehicle audio system). For example, system 100 may provide various notifications (e.g., alerts) via speakers 360.

As will be appreciated by a person skilled in the art having the benefit of this disclosure, numerous variations and/or modifications may be made to the foregoing disclosed embodiments. For example, not all components are essential for the operation of system 100. Further, any component may be located in any appropriate part of system 100 and the components may be rearranged into a variety of configurations while providing the functionality of the disclosed embodiments. Therefore, the foregoing configurations are examples and, regardless of the configurations discussed above, system 100 can provide a wide range of functionality to analyze the surroundings of vehicle 200 and, in response to this analysis, navigate and/or otherwise control and/or operate vehicle 200. Navigation, control, and/or operation of vehicle 200 may include enabling and/or disabling (directly or via intermediary controllers, such as the controllers mentioned above) various features, components, devices, modes, systems, and/or subsystems associated with vehicle 200. Navigation, control, and/or operation may alternately or additionally include interaction with a user, driver, passenger, passerby, and/or other vehicle or user, which may be located inside or outside vehicle 200, for example by providing visual, audio, haptic, and/or other sensory alerts and/or indications.

As discussed below in further detail and consistent with various disclosed embodiments, system 100 may provide a variety of features related to autonomous driving, semi-autonomous driving and/or driver assist technology. For example, system 100 may analyze image data, position data (e.g., GPS location information), map data, speed data, and/or data from sensors included in vehicle 200. System 100 may collect the data for analysis from, for example, image acquisition device 120, position sensor 130, and other sensors. Further, system 100 may analyze the collected data to determine whether or not vehicle 200 should take a certain action, and then automatically take the determined action without human intervention. It would be appreciated that in some cases, the actions taken automatically by the vehicle are under human supervision, and the ability of the human to intervene adjust abort or override the machine action is enabled under certain circumstances or at all times. For example, when vehicle 200 navigates without human intervention, system 100 may automatically control the braking, acceleration, and/or steering of vehicle 200 (e.g., by sending control signals to one or more of throttling system 220, braking system 230, and steering system 240). Further, system 100 may analyze the collected data and issue warnings, indications, recommendations, alerts, or instructions to a driver, passenger, user, or other person inside or outside of the vehicle (or to other vehicles) based on the analysis of the collected data. Additional details regarding the various embodiments that are provided by system 100 are provided below.

The system may apply error correction coding in a highly efficient manner in terms of throughput and low latency. The arrangement of data sub-blocks and error correction code sub-blocks at the same row, the writing of data sub-blocks and error correction sub-blocks to a row of a dynamic memory module while the row is open may increase the write throughput by a factor of two and the caching of the error correction blocks in a cache memory may also increase the reading throughput by a factor of two.

This increase in reading and writing throughput dramatically reduces the penalty associated with error correction—and enables to apply error correction coding (ECC) even to (but not necessarily to) all the regions in the dynamic memory module, for example (but not limited to) sensor images—and not only code.

Applying ECC on sensor images and especially lower resolution images such as radar sensor acquired images and LIDAR sensor acquired images increases the reliability of such images, reduces required level of redundancy and so allows using fewer number of sensors—thereby reducing the cost of the system, simplifying the system and reducing the size, and energy consumption of the system. Accordingly—applying the ECC on LIDAR images may replace the need of using redundant LIDAR sensors to compensate for LIDAR image errors.

The low penalty associated with applying the ECC may ease the applying of ECC on the images acquired by the image acquisition device 120 and also on any processed image (or temporary data) generated during any one out of autonomous driving operations, semi-autonomous driving operations and/or driver assist technology operations such as but not limited to automatic lane tracking, pedestrian detection, autonomous breaking, and the like.

Applying ECC on code and on data of various types increases the reliability of the outputs of the system and allows to operate the vehicle in a more optimal manner—even with lower safeguards.

Applying ECC on code and on data of various types reduces the chances of failures, reduces the system Failure In Time (FIT) parameter—and provides a more robust system.

Figure 4:
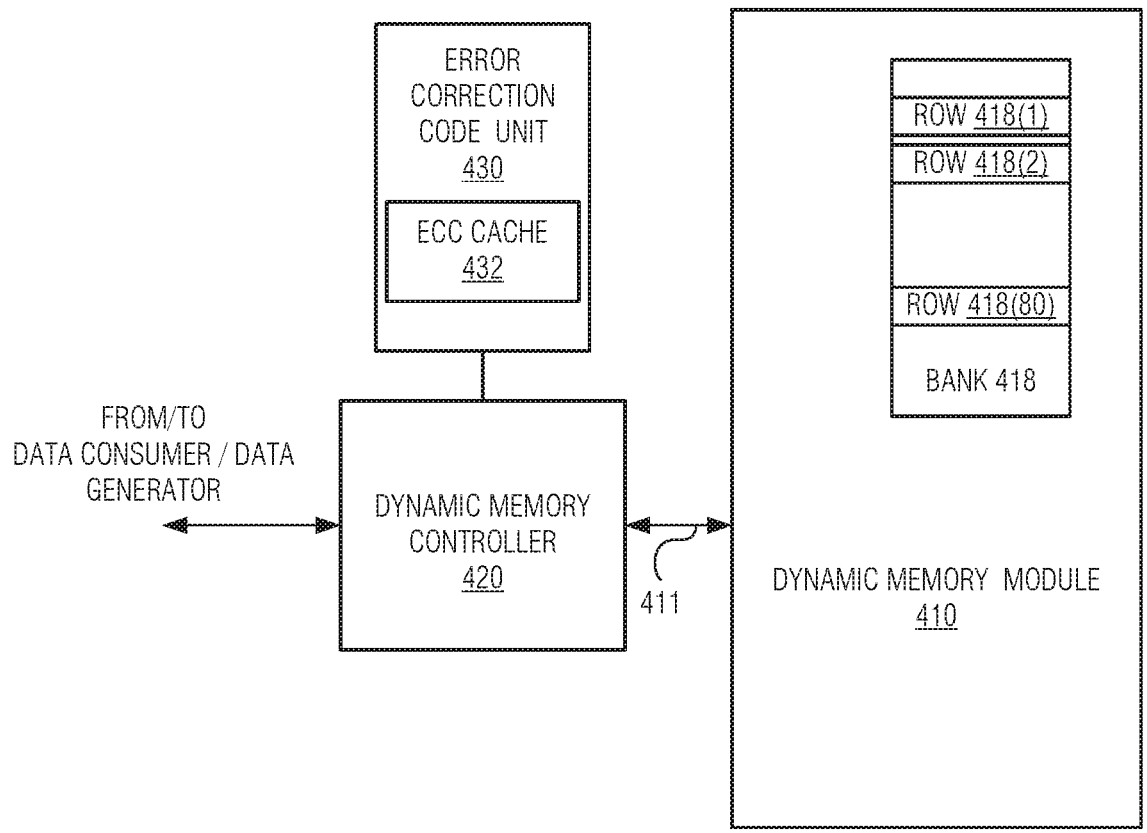
FIG. 4 is a block diagram of a dynamic memory module, a dynamic memory controller, an error correction code unit consistent with the disclosed embodiments.
Figure 5:
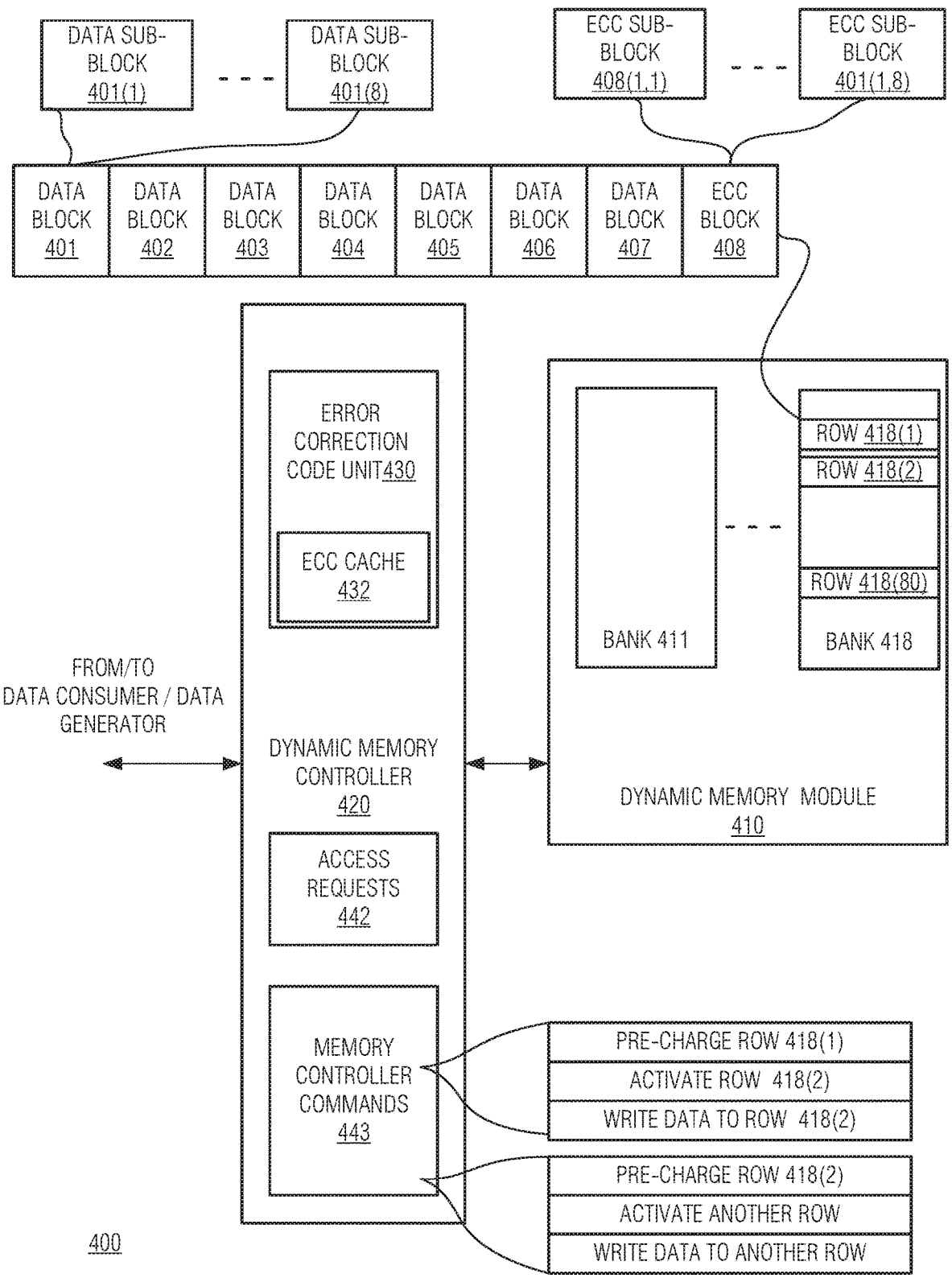
FIG. 5 is a block diagram of a dynamic memory module and a dynamic memory controller that includes an error correction code unit consistent with the disclosed embodiments.

FIGS. 4 and 5 illustrates an example of a dynamic memory module 410 and a dynamic memory controller 420. The dynamic memory module may be a DRAM and/or a DDR (double data rate) memory module. In some of the examples below it is assumed that the dynamic memory module is a DDR memory module.

An in-line ECC configuration may be used in which the error correction sub-blocks (also referred to as ECC sub-blocks) and data sub-blocks are sent (from the dynamic memory module and to the dynamic memory module) over the same communication link in a serial manner. Thus, ECC bits and data bits are sent over the same pins (or other interface) of the dynamic memory module—in a serial manner. The in-line ECC configuration may require only a single dynamic memory module for storing the ECC and data and is LPDDR4 compliant.

The dynamic memory module may be, for example, any one of memory modules 140 and 150 of FIG. 1.

The dynamic memory module 410 may receive (over communication link 411) data sub-blocks that originated from data generators such as application processor 180 and image processor 190 of FIG. 1 (or from any other data generator).

The dynamic memory module 410 may output (over communication link 411) data sub-blocks to data consumers such as application processor 180 and image processor 190 of FIG. 1 (or to any other data consumer).

In FIG. 4 the dynamic memory controller is coupled to an ECC unit 430. In FIG. 5 the ECC unit 430 is included in the dynamic memory controller 420.

The dynamic memory module 410 may include one or more memory banks.

FIG. 4 illustrates a single memory bank 418 while FIG. 5 illustrates eight memory banks 411-418. The dynamic memory module 410 may include any number of memory banks. For DDR use performance reasons, it's beneficial to store the ECC blocks together with the corresponding data blocks in the same DDR row.

During write operations the ECC unit 430 may apply ECC operations on incoming data sub-blocks to provide ECC sub-blocks.

Every data write to DDR requires the corresponding ECC generation and subsequent ECC write to ECC cache/buffer (432).

Any ECC that is buffered in DDR, controller for write data, should be written to memory at some point.

There may be various possible triggers for writing the ECC to DDR. For example:
There is a need to buffer other data commands and LRU ECC may need to be replaced
There is a need to clean the DDR controller state before entering into low power modes During read operations the ECC unit 430 may apply ECC check on data sub-blocks read from the dynamic memory module 410 in order to detect errors and correct errors. Every data read from DDR requires a subsequent corresponding ECC read, unless this particular ECC is already present in ECC cache/buffer The ECC unit 430 may perform ECC operations (generation or check) on all the data stored in the dynamic memory module 410 or on predefined regions of the dynamic memory module 410 that require ECC protection.

FIG. 5 illustrates a row 418(2) of memory bank 418 of dynamic memory module 410 that stores seven data blocks 401-407 and an ECC block 408. Memory bank 418 may have any number of rows and rows 418(1), 418(2), and 418(80) are only examples of some of the rows of memory bank 418.

Each data block may include multiple data sub-blocks, for example data sub-blocks 410(1)-401(8) of data block 401. The data sub-blocks may be transferred during one or more data bursts.

ECC block 408 may include ECC sub-blocks, for example ECC sub-blocks 408(1,1)-408(1,8) that are related to data sub-blocks 401(1)-401(8).

The data blocks and the ECC block may be 512-byte long and each sub-block may be 64-byte long. Other sizes may be supported. The relationship between the size and/or number of the ECC block and the size and/or number of data blocks per row may differ from those illustrated in FIG. 5.

An ECC sub-block may be calculated by the ECC unit 430 whenever a data sub-block is received or in a later point of time.

An ECC sub-block may be cached in an ECC cache 432 before the ECC sub-block is written to the dynamic memory module 410. The ECC sub-block may be written to the dynamic memory module 410 at any time after the ECC sub-block is calculated. ECC cache 432 is just an example or a memory unit that may store the ECC sub-block. For example, a buffer may be used for storing the ECC sub-block.

Dynamic memory module 410 may include one or more memory banks. In each memory bank, up to a single row may be opened (activated) at a time.

A write operation to a certain row (that is currently closed) of the dynamic memory module 410 requires to close another row (that is currently open), activate the certain row and write one or more data sub-blocks to the certain row.

It has been found that it is highly beneficial to write to the certain row all ECC sub-blocks that (a) are related to data sub-blocks stored in that certain row and (b) were generated while the certain row is still open, before the certain row is closed.

Writing the ECC sub-blocks related to the certain row—after the certain row is closed—required to close a currently active row, activate (again) the certain row and write one or more ECC sub-blocks to the certain row. This process is time and DDR bandwidth consuming.

For example, when writing the ECC sub-blocks related to the certain row, after the certain row is closed (e.g., every 7 bursts of data), the current row should be PRECHARGED and another ECC row activated and written. The latencies are:

$$7*(tRP+tRCD+WL+8_{data}*4+tRP+tRCD+WL+1_{ECC}*4)=1092 \text{ cycles}$$

Wherein tRP—Row precharge time; tRCD–RAS-to-CAS delay (RAS—row activation strobe, CAS—column activation strobe) and WL—write latency. And wherein it is assumed that tRP=tRCD=RL=WL=20 cycles and burst length=16 (64 bytes, 4 cycles).

As another example, when writing the ECC sub-blocks related to the certain row, before the certain row is closed, every 7 bursts of data, the additional 1 burst of ECC should be written to same row. ECC does not require additional PRECHARGE/ACTIVATE command and can be written back to back with the data. The latencies are: $tRP+tRCD+WL+7*(8_{data}+1_{ECC})*4=312$ cycles. Yet for another example of parameters that may be used Activation: tRP=tRCD=RL=WL=20 cycles and burst length=16 (64 bytes, 4 cycles).

The dynamic memory controller 420 controls the various operations related to the dynamic memory module 410 (including the write operation, the pre-charging operation and the activating operation) and may determine when to perform the writing of the one or more ECC sub-blocks before the certain row is closed.

The dynamic memory controller 420 may receive access requests (denoted 442 in FIG. 5) and convert these access requests to dynamic memory controller commands such as pre-charging row, activate row and read or write row (see box 443 in FIG. 5).

FIG. 5 illustrates two triplets of dynamic memory controller commands 443:
1. Pre-charge row 418(1).
2. Activate row 418(2).
3. Write data to row 418(2).
4. Pre-charge row 418(2)
5. Activate another row.
6. Read or write to the other row.

It should be noted that after activating the row multiple read and/or write commands may be executed.

It is beneficial to write to row 418(2) all the ECC sub-blocks calculated during the execution of the third command (read or write row 418(2)) before the execution of the fourth command (pre-charge row 418(2)).

Thus—the dynamic memory controller commands may include:
1. Pre-charge row 418(1).
2. Activate row 418(2).
3. Write data to row 418(2).
i. Write ECC to row 418(2).
4. Pre-charge row 418(2)
5. Activate another row.
6. Read or write to the other row.

Figure 6:
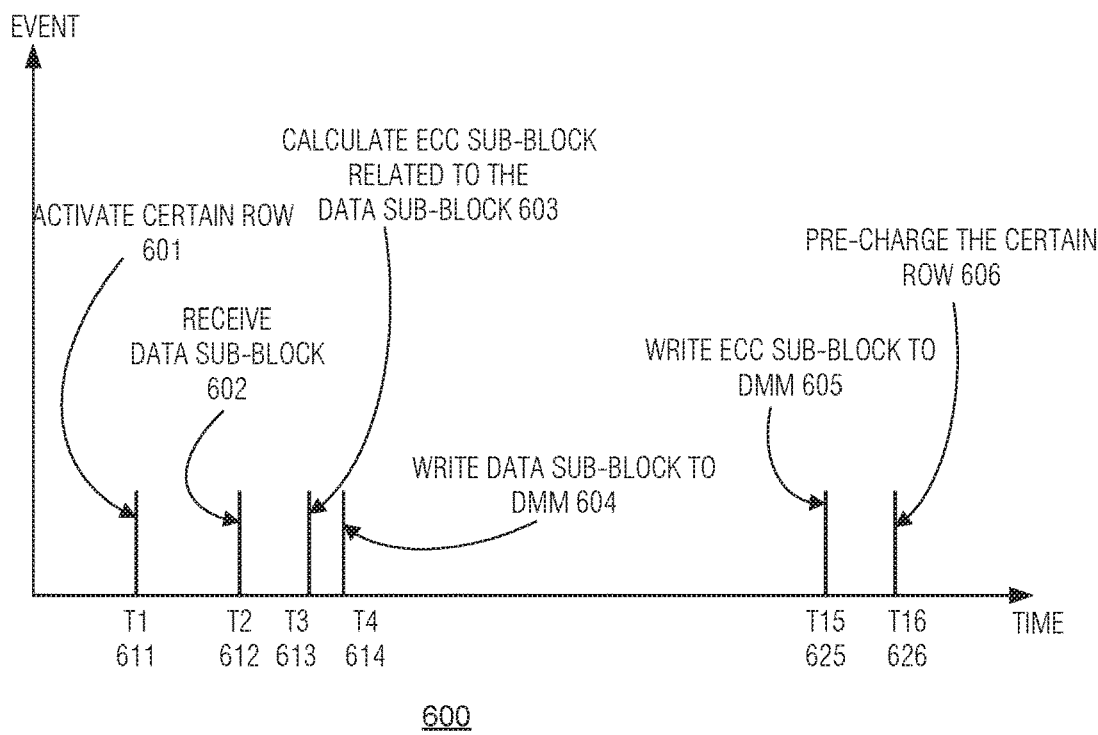
FIG. 6 illustrates timing diagrams consistent with the disclosed embodiments.
Figure 6:
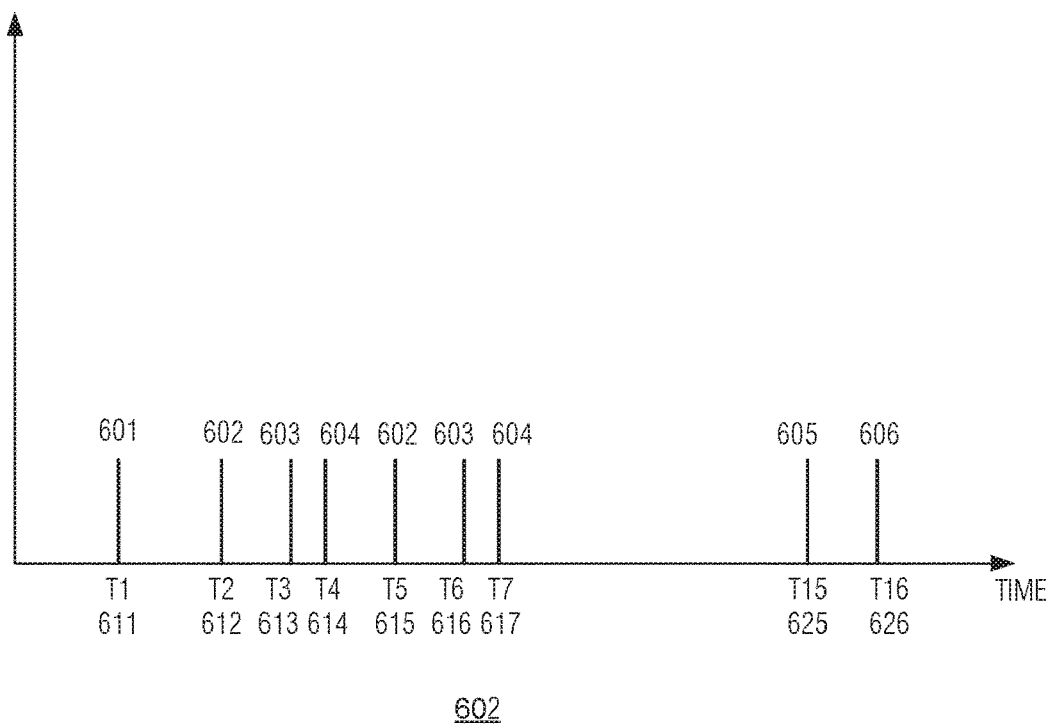

FIG. 6 illustrates two timing diagrams 600 and 602.

Timing diagram 600 illustrates the following sequence of events (T denotes a point in time):
1. T1 611—activate certain row 601.
2. T2 612—receive a data sub-block 602.
3. T3 613—calculate ECC sub-block related to the data sub-block 603.
4. T4 614—write data sub-block to the dynamic memory module 604.
5. T15 625—write ECC sub-block to the dynamic memory module 605.
6. T16 626—pre-charge the certain row 606.

It is noted that event 603 may follow event 604, that events 603 and 604 may occur simultaneously.

It should be noted that the writing of the data sub-blocks to the dynamic memory module may be executed upon a reception of a single data sub-block, that multiple data sub-blocks may be aggregated before they are written to the dynamic memory module, and the like.

Timing diagram 602 illustrates two repetitions of events 602, 603 and 604 before the occurrence of event 605.

Timing diagram 602 illustrates the following sequence of events (T denotes a point in time):
1. T1 611—activate certain row 601.
2. T2 612—receive a data sub-block 602.
3. T3 613—calculate ECC sub-block related to the data sub-block 603.
4. T4 614—write data sub-block to the dynamic memory module 604.
5. T5 615—receive a data sub-block 602.
6. T6 616—calculate ECC sub-block related to the data sub-block 603.
7. T7 617—write data sub-block to the dynamic memory module 604.
8. T15 625—write ECC sub-block to the dynamic memory module 605.
9. T16 626—pre-charge the certain row 606.

Figure 7:
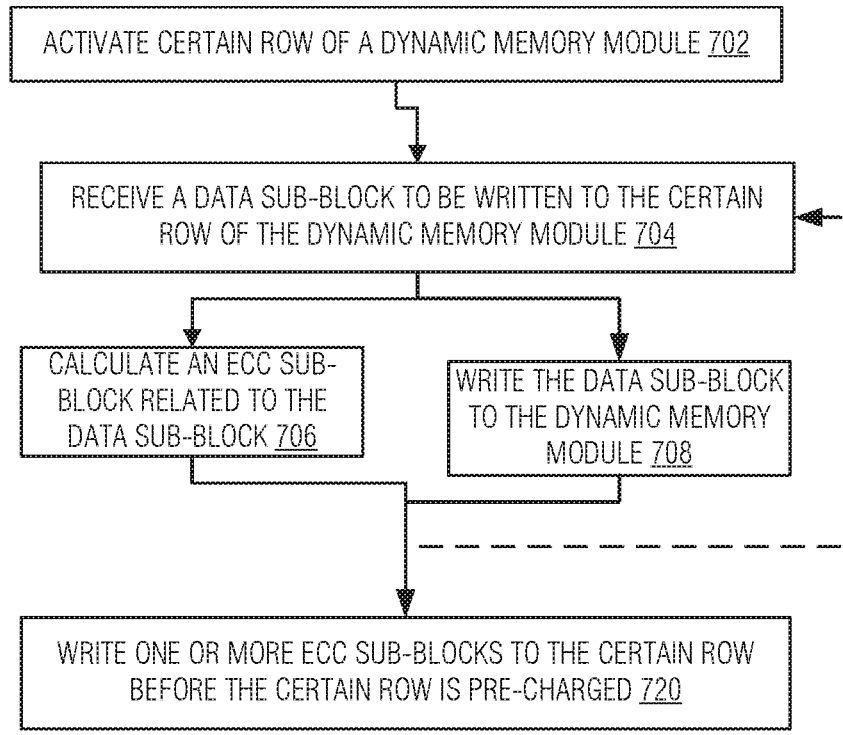
FIG. 7 illustrates a method consistent with the disclosed embodiments.

FIG. 7 is a flow chart that illustrates method 700.

Method 700 may start by step 702 of activating a certain row of a dynamic memory module.

Step 702 may be triggered by a write command that is received by a dynamic memory controller.

Step 702 may be followed by step 704 of receiving (by a dynamic memory controller) a data sub-block to be written to the certain row of the dynamic memory module.

A data sub-block to be written to (or targeted to) the certain row may be associated (by the dynamic memory controller or by another entity) with address information that indicates that the data-sub-block should be written to the certain row.

Step 704 may be followed by steps 706 and 708.

Step 706 may include calculating an ECC sub-block related to (protecting) the data sub-block.

Step 708 may include writing the data sub-block to the dynamic memory module over the communication link.

Steps 706 and 708 may be followed by step 720 of writing one or more ECC sub-blocks to the certain row before the certain row is pre-charged.

The writing of the data unit to the dynamic memory module includes sending the data unit over the communication link.

Method 700 utilizes the in-line ECC configuration—the same communication line is used for conveying data bits and ECC bits at different points of time.

Steps 702-720 may be repeated for multiple rows—especially one row after the other. Each iteration a row is selected and after steps 702-720 are executed the method may be executed in relation to a new selected row. The certain row of FIG. 7 is an example of a selected row.

Method 700 may, for example, be executed as a part of a ADAS operation and/or an autonomous vehicle operation. Method 700 may be used for any other purpose.

Figure 8:
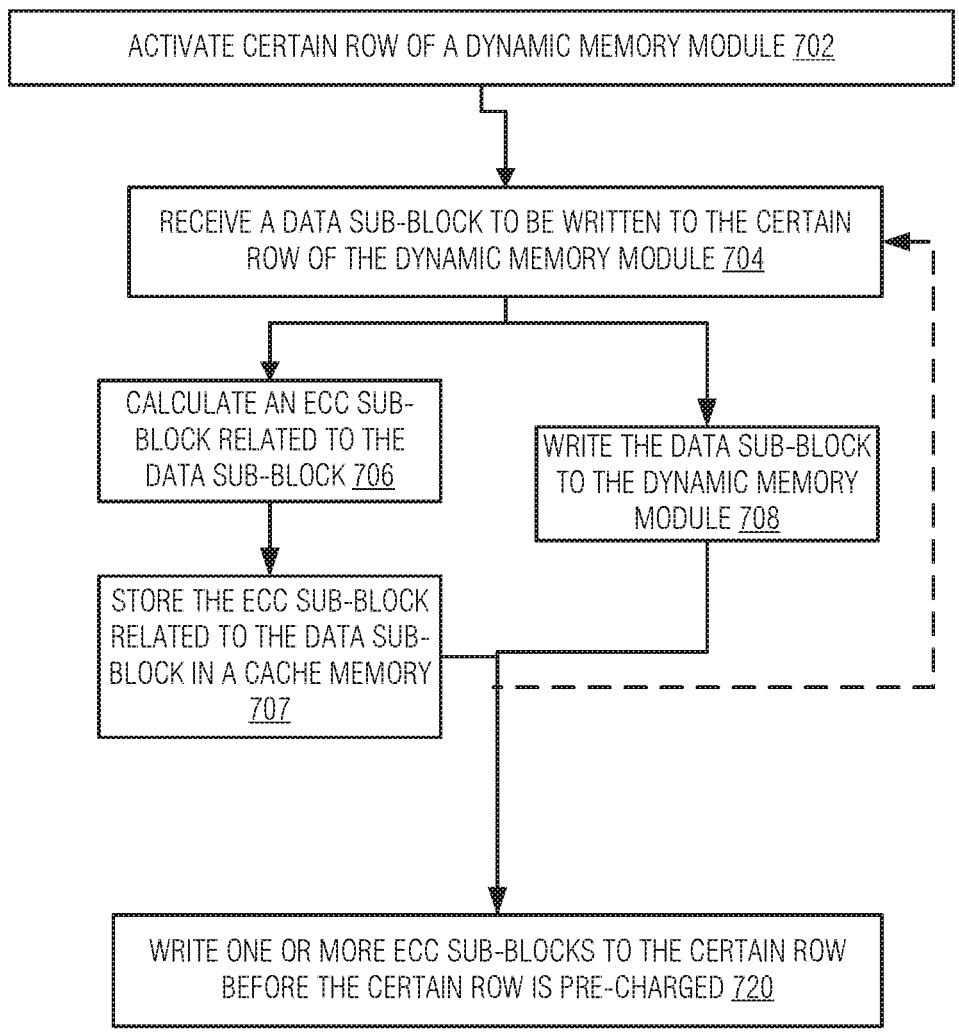
FIG. 8 illustrates a method consistent with the disclosed embodiments.

FIG. 8 illustrates a method 701 that further includes step 707 of storing the ECC sub-block related to the data sub-block in a cache memory (for example ECC cache 432 of FIG. 5). Step 707 follows step 706 and precedes step 708.

Multiple iterations of steps 704, 706 and 708 may occur between the execution of steps 702 and 720.

Figure 9:
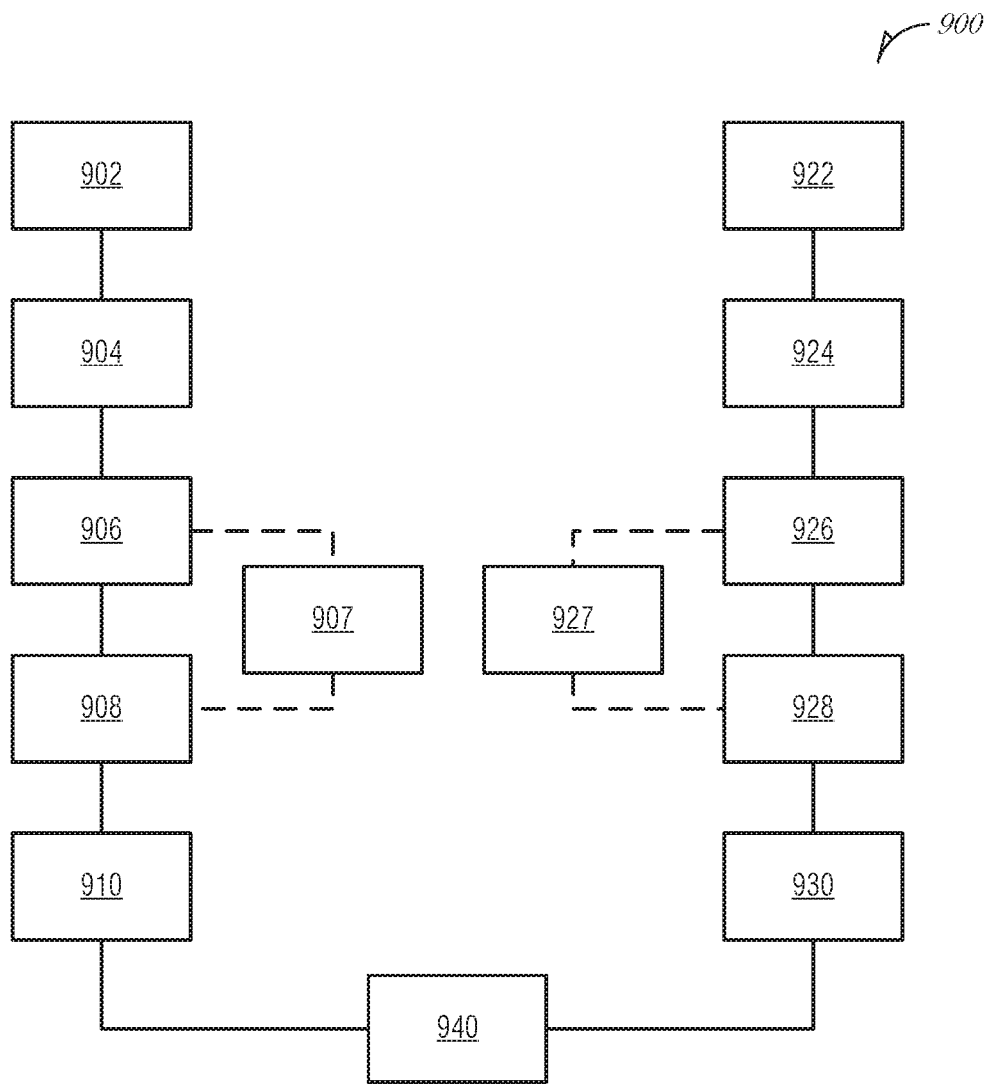
FIG. 9 illustrates an example of a method.

FIG. 9 illustrates an example of method 900.

Method 900 may start by steps 902 and 922.

Step 902 may include opening a first selected row of a first memory bank that belongs to a first group of memory banks of a dynamic memory module.

Step 902 may be followed by step 904 of receiving first selected data sub-blocks, while the first selected row is open, by the dynamic memory module, wherein the first selected data sub-blocks are received over a communication link and are targeted to be written to the first selected row.

Step 904 may be followed by step 906 of calculating, while the second selected row is open and by an error correction unit, first selected error correction code sub-blocks that are related to the first selected data sub-blocks.

Step 906 may be followed by step 907 of caching the first selected error correction code sub-blocks in a cache memory that differs from the dynamic memory module.

Step 906 (or step 907—if such exists) may be followed by step 908 of writing the first selected data sub-block to the first selected row.

Step 908 may be followed by step 910 of writing, to the second selected row, the first selected error correction code sub-blocks while the second selected row is open; wherein the writing comprises sending the second selected error correction code sub-blocks to the dynamic memory module over the communication link.

Step 922 may include opening a second selected row of a second memory bank that belongs to a second group of memory banks of the dynamic memory module.

Step 922 may be followed by step 924 of receiving second selected data sub-blocks, while the second selected row is open, by the dynamic memory module, wherein the second selected data sub-blocks are received over the communication link and are targeted to be written to the second selected row.

Step 924 may be followed by step 926 of calculating, while the first selected row is open and by an error correction unit, second selected error correction code sub-blocks that are related to the second selected data sub-blocks.

Step 926 may be followed by step 927 of caching the second selected error correction code sub-blocks in a cache memory that differs from the dynamic memory module.

Step 926 (or step 927—if such exists) may be followed by step 928 of writing the second selected data sub-block to the second selected row.

Step 928 may be followed by step 930 of writing, to the first selected row, the second selected error correction code sub-blocks while the first selected row is open; wherein the writing comprises sending the second selected error correction code sub-blocks to the dynamic memory module over the communication link.

Steps 910 and 930 may be followed by step 940 of closing the first and second selected rows.

Step 940 may include pre-charging the first and second selected rows.

Steps 908, 910, 928 and 930 may be executed in an interleaved manner. Accordingly, after the writing, to the first group of memory banks, any sub-block (ECC sub-block or data sub-block), the method proceeds by writing, to the second group of memory banks, another sub-block.

The interleaving may be performed in any manner—for example by using the least significant bit of an address to select between memory banks (or between groups of memory banks).

The interleaving may be between two or more memory banks of two or more groups of memory banks.

The outcome of the execution of steps 908, 910, 928 and 930 may include storing in each one of the first and second selected rows more data sub-blocks than error correction code sub-blocks.

The outcome of the execution of steps 908 and 930 may include storing, in the first selected row, first data blocks and a single second error correction code block. Each first data block comprises first data sub-blocks. The single second error correction code block may include second error correction code sub-blocks.

The outcome of the execution of steps 928 and 910 may include storing, in the second selected row, second data blocks and a single first error correction code block. Each second data block comprises second data sub-blocks. The single first error correction code block may include first error correction code sub-blocks.

The dynamic memory module may enforce a time gap between consecutive accesses to the same group of memory banks. This may be an inherent limitation of the dynamic memory module.

The time gap may be significant in the sense that its duration is of the order of a duration of a write or read operation of a burst of data atoms. The time gap may exceed the duration of the read or write operation of the burst of data atoms. The data atoms that are written (or read) during the burst may be regarded as a data sub-block.

Storing error correction sub-blocks related to data sub-blocks stored one group of memory banks, in another group of memory banks, enable a seamless access to the data sub-blocks and the error correction sub-blocks—without incurring the time gap between consecutive accesses to the same group of memory banks.

Figure 10:
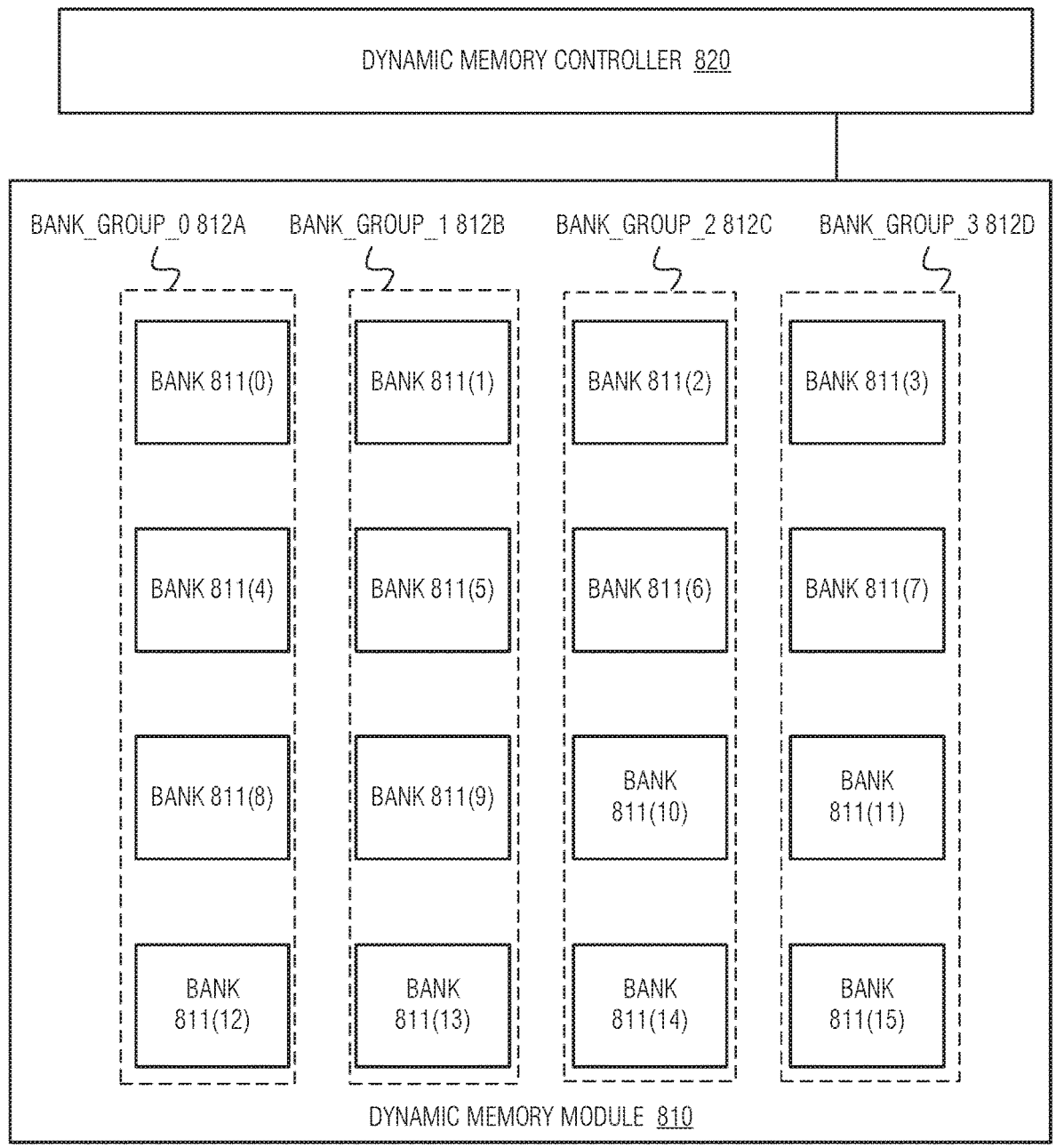
FIG. 10 is an example of a dynamic memory controller and of a dynamic memory module.

FIG. 10 is an example of a dynamic memory controller 820 and of a dynamic memory module 1010.

For simplicity of explanation, it is assumed that there are four groups of memory banks and four memory banks per group. This is merely a non-limiting example of the number of groups of memory banks and of the number of memory banks per group of memory banks.

Dynamic memory module 1010 includes sixteen memory banks Bank 811(0)-Bank 811(15) that are arranged in four groups of memory banks—Bank_Group_0 812A, Bank_Group_1 812B, Bank_Group_2 812C, and Bank_Group_3 812D.

First group of memory banks Bank_Group_0 812A includes first, fifth, ninth and thirteenth memory banks 811(0), 811(4), 811(8) and 811(12).

Second group of memory banks Bank_Group_1 812B includes second, sixth, tenth and fourteenth memory banks 811(1), 811(5), 811(9) and 811(13).

Third group of memory banks Bank_Group_2 812C includes third, seventh, eleventh and fifteenth memory banks 811(2), 811(6), 811(10) and 811(14).

Fourth group of memory banks Bank_Group_3 812D includes fourth, eighth, twelfth and sixteenth memory banks 811(3), 811(7), 811(11) and 811(15).

Any other mapping between memory banks and group of memory banks may be provided.

It is assumed that a sequential writing of data sub-blocks is converted to an interleaved writing of the data sub-blocks between the different groups of memory banks—so that the sequential writing is not penalized by the time gap introduced between successive writing to the same group.

For example, a first sequence of data sub-blocks may be written in an interleaved manner to the first and second groups of memory banks Bank_Group_0 812A and Bank_Group_1 812B. The error correction sub-blocks related to the first sequence may also be written in an interleaved manner to the first and second groups of memory banks. Wherein an error correction sub-block related to a data sub-block that is written to the first group of memory banks is written to the second group of memory banks—and vise-verse.

In addition—and even parallel to the writing of the first sequence—a second sequence of data sub-blocks may be written in an interleaved manner to the third and fourth groups of memory banks Bank_Group_2 812C and Bank_Group_3 812D.

The error correction sub-blocks related to the second sequence may also be written in an interleaved manner to the third and fourth groups of memory banks. Wherein an error correction sub-block related to a data sub-block that is written to the third group of memory banks is written to the fourth group of memory banks—and vise-verse.

Figure 11:
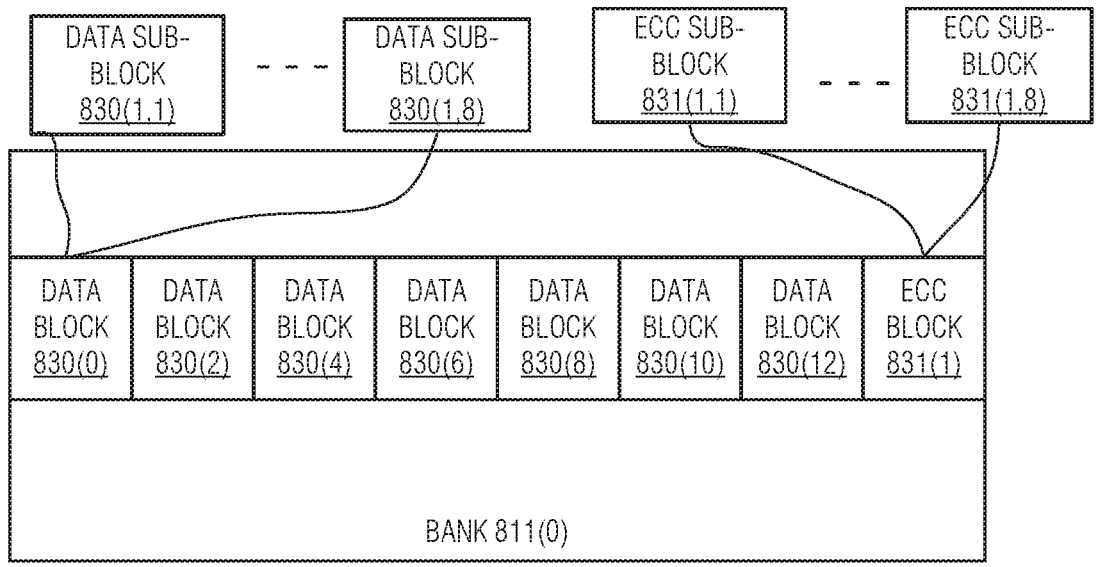
FIG. 11 illustrates first data blocks, a first ECC block, second data blocks and a second ECC block.
Figure 11:
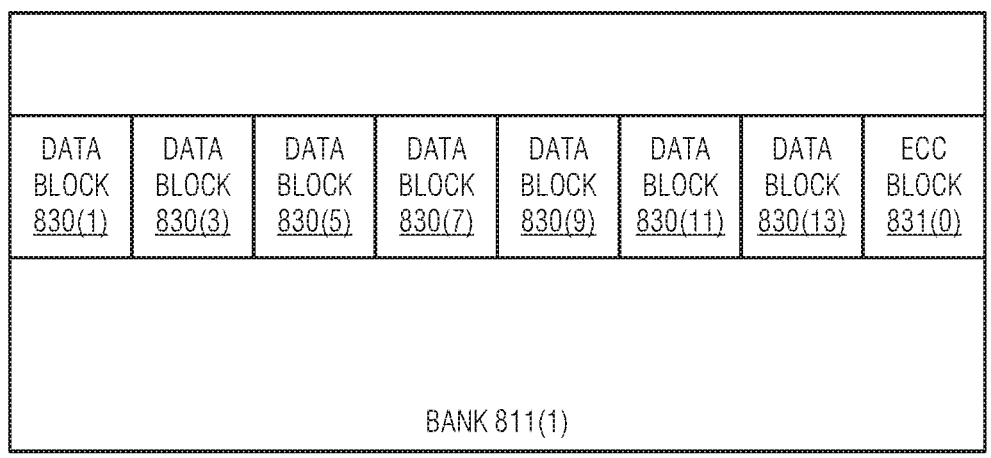

FIG. 11 illustrates first data blocks, first ECC block, second data blocks and second ECC block.

A sequence of data blocks includes data block 830(0), data block 830(1), data block 830(2), data block 830(3), data block 830(4), data block 830(5), data block 830(6), data block 830(7), data block 830(8), data block 830(9), data block 830(10), data block 830(11), data block 830(12), and data block 830(13).

These data blocks are written in an interleaved manner to a first row of memory bank 811(0) of Bank_Group_0 812A and to a second row of memory bank 811(1) of Bank_Group_1 812B.

Data block 830(0), data block 830(2), data block 830(4), data block 830(6), data block 830(8), data block 830(10), and data block 830(12) are written to the first row of memory bank 811(0).

Data block 831(1), data block 831(3), data block 831(5), data block 831(7), data block 831(9), data block 831(11), and data block 831(13) are written to the first row of memory bank 811(1).

First ECC block 831(0) that is calculated on the odd data blocks (stored in memory bank 811(0)) is stored in the second row.

Second ECC block 831(1) that is calculated on the even data blocks (stored in memory bank 811(1)) is stored in the first row.

Each sub-block includes multiple (for example eight) sub-blocks. For example—data block 830(0) includes eight data sub-blocks 830(1,1)-830(1,8), first ECC block 831(1) includes eight data sub-blocks 831(1,1)-831(1,8).

The first and second rows may reside at the same address (within the different memory banks)—or at different addresses within the different memory banks.

A single sub-block may be written to the dynamic memory module (or may be read from the dynamic memory module) during a single write (or read) operation. Each sub-block may include multiple data atoms that are read (or written) in a burst.

Figure 12:
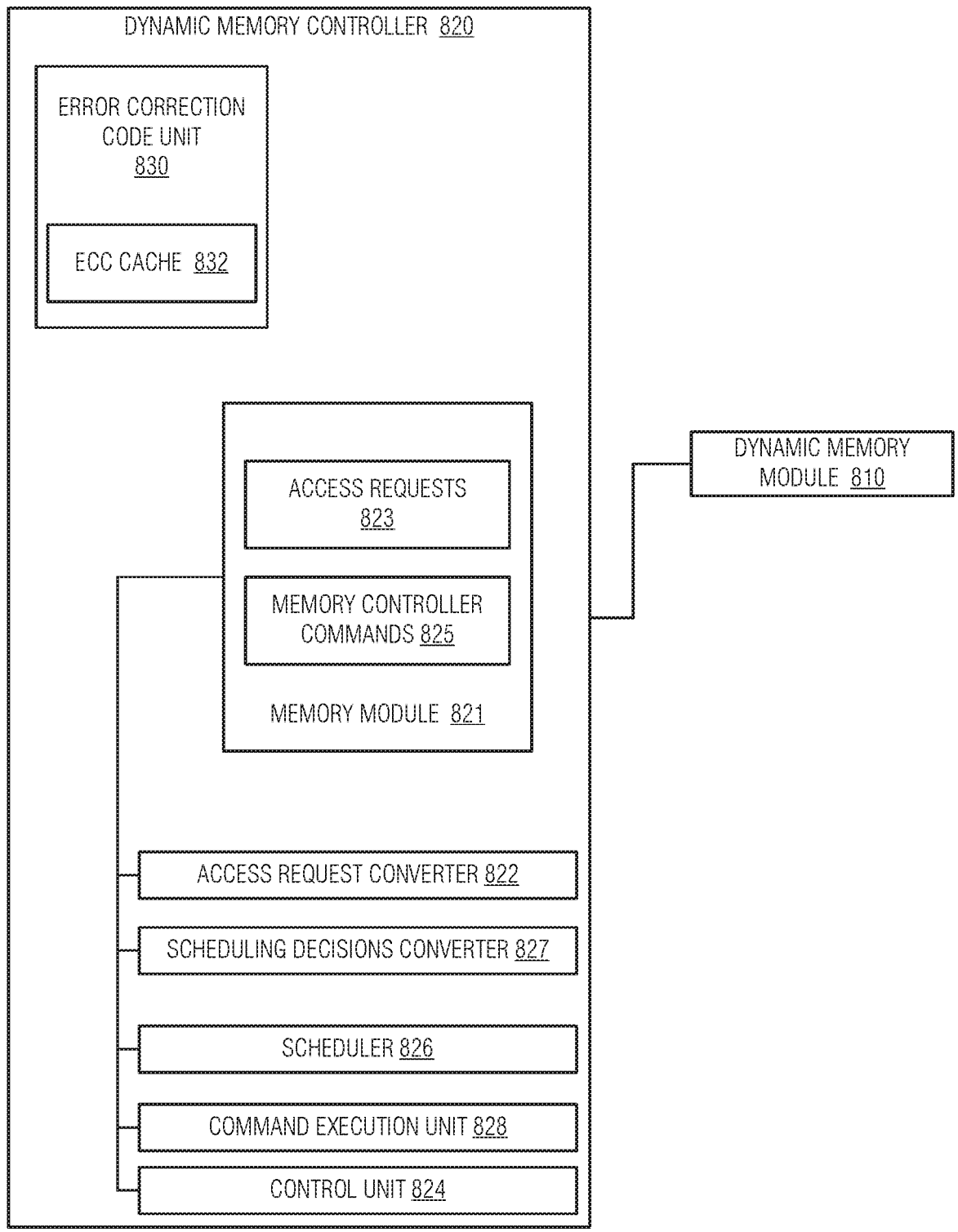
FIG. 12 illustrates a dynamic memory module and a dynamic memory controller.
Figure 13:
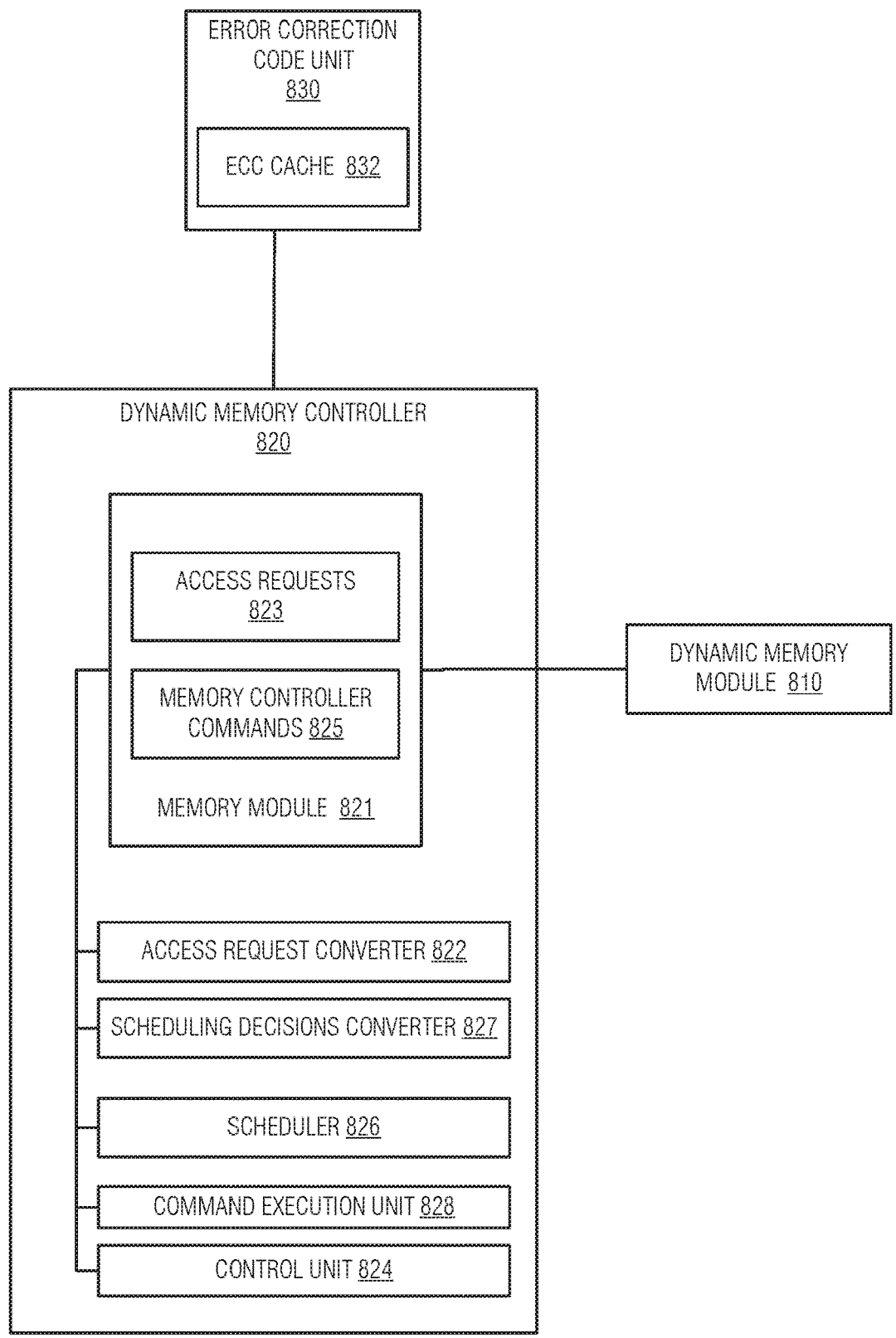
FIG. 13 illustrates a dynamic memory module and a dynamic memory controller.

FIG. 12 illustrates that the dynamic memory controller 820 may include an error correction code unit 830 that includes an ECC cache 832 for storing error correction codes sub-blocks. FIG. 13 illustrates that the dynamic memory controller 820 may be coupled to an error correction code unit 830 that includes an ECC cache 832 for storing error correction codes sub-blocks.

FIGS. 12 and 13 illustrate the dynamic memory controller as including a memory module 821, converter 822, control unit 824, scheduler 826, scheduling decision converter 827, and command execution unit 828. Any other dynamic memory controller may be provided.

The dynamic memory controller 820 may include one or more integrated circuits. The memory module 821, access request converter 822, control unit 824, scheduler 826, scheduling decision converter 827, and command execution unit 828 may be included in the one or more integrated circuits, may include one or more hardware accelerators, may be included in one or more processing circuits.

Memory module 821 may store access requests 823 (such as read, write, refresh and the like) and memory controller commands ("commands") 825.

Access request converter 822 may be constructed and arranged to convert a set of access requests to a set of commands. The commands are sent to the dynamic memory module and facilitate the execution of the access requests. The commands may include, in addition to data related commands (such as read, write, and the like), management commands such as activate, pre-charge, and the like).

The set of commands may include (a) a first sub-set of commands that are related to a first group of memory banks, and (b) a second sub-set of commands that are related to a second group of memory banks.

Scheduler 826 may be constructed and arranged to schedule an execution of the first sub-set. This can be executed without reading the second sub-set.

Scheduling decision converter 827 may be constructed and arranged to schedule an execution of the second sub-set to be interleaved with the execution of the first sub-set.

Command execution unit 828 may be constructed and arranged to execute the set of commands according to the schedule. This may include, for example, pre-charging, read and/or write operations, activating, refreshing, and the like.

Alternatively, scheduler 826 is constructed and arranged to schedule the execution of all commands of the set, while reading all (or at least some) of the commands of the set of commands. Various examples of a dynamic memory controller are illustrated in PCT patent application PCT/IL2018/050431 (publication WO 2018193448) and are illustrated in PCT patent application PCT/IL2018/050432 (publication WO 2018193449).

There may be provided a method for accessing a dynamic memory module, the method may include:
1. Opening a first selected row of a first memory bank that belongs to a first group of memory banks of a dynamic memory module;
2. Opening a second selected row of a second memory bank that belongs to a second group of memory banks of the dynamic memory module;
3. Receiving first selected data sub-blocks, while the first selected row may be open, by the dynamic memory module, wherein the first selected data sub-blocks may be received over a communication link and may be targeted to be written to the first selected row;
4. Receiving second selected data sub-blocks, while the second selected row may be open, by the dynamic memory module, wherein the second selected data sub-blocks may be received over the communication link and may be targeted to be written to the second selected row;
5. Calculating, while the second selected row may be open and by an error correction unit, first selected error correction code sub-blocks that may be related to the first selected data sub-blocks;
6. Caching the first selected error correction code sub-blocks in a cache memory that differs from the dynamic memory module;
7. Calculating, while the first selected row may be open and by an error correction unit, second selected error correction code sub-blocks that may be related to the second selected data sub-blocks;
8. Caching the second selected error correction code sub-blocks in the cache memory that differs from the dynamic memory module;
9. Writing, to the first selected row, the second selected error correction code sub-blocks while the first selected row may be open; wherein the writing may include sending the second selected error correction code sub-blocks to the dynamic memory module over the communication link;
10. Writing, to the second selected row, the first selected error correction code sub-blocks while the second selected row may be open; wherein the writing may include sending the second selected error correction code sub-blocks to the dynamic memory module over the communication link; and
11. Closing the first and second selected rows.

The writing of the second selected error correction code sub-blocks and the writing of the first selected error correction code may be executed in an interleaved manner.

The method may include writing, in an interleaved manner, (a) the first selected data sub-blocks and the second selected error collection code sub-blocks to the first selected row, and (b) the second selected data sub-blocks and the first selected error collection code sub-blocks to the second selected row.

The closing of the first and second selected rows may include pre-charging the first and second selected rows.

The method may include storing in each one of the first and second selected rows more data sub-blocks than error correction code sub-blocks.

The method may include storing, in the first selected row, first data blocks and a single second error correction code block; wherein each first data block may include first data sub-blocks, and wherein the single second error correction code block may include second error correction code sub-blocks.

The method may include
1. Opening a new first selected row that belongs to the first group of memory banks;
2. Opening a new second selected row that belongs to the second group of memory banks;
3. Receiving by the dynamic memory module, over the communication link and while the new first selected row may be open, new first selected data sub-blocks that may be targeted to be written to the new first selected row;
4. Receiving by the dynamic memory module, over the communication link and while the new second selected row may be open, new second selected data sub-blocks that may be targeted to be written to the new second selected row;
5. Calculating, by the error correction unit, while the new second selected row may be open, new first selected error correction code sub-blocks that may be related to the new first selected data sub-blocks;
6. Calculating, by the error correction unit, while the new first selected row may be open, new second selected error correction code sub-blocks that may be related to the new second selected data sub-blocks;
7. Caching the new first selected error correction code sub-blocks in the cache memory;
8. Caching the new second selected error correction code sub-blocks in the cache memory;
9. Writing, to the new second selected row, the new first selected error correction code sub-blocks while the new second selected row may be open; wherein the writing may include sending the new first selected error correction code sub-blocks to the dynamic memory module over the communication link;
10. Writing, to the new first selected row, the new second selected error correction code sub-blocks while the new first selected row may be open, the writing may include sending the new second selected error correction code sub-blocks to the dynamic memory module over the communication link; and
11. Closing the new first selected row and the new second selected row.

The method may include:
1. Receiving a request for reading a first plurality of data sub-blocks blocks that may be stored at different memory banks of the multiple memory banks of the dynamic memory module;
2. Checking whether the cache memory stores error correction sub-blocks that may be related to any of the first plurality of data sub-blocks;
3. Retrieving, from the dynamic memory module and over the communication link, the first plurality of data sub-blocks blocks;
4. Retrieving error correction sub-blocks that may be related to the first plurality of data sub-blocks; wherein the retrieving may include retrieving from the cache memory, instead from the dynamic memory module, any error correction sub-block that may be stored in the cache memory and may be related to any of the first plurality of data sub-blocks; and error correcting the first plurality of data sub-blocks to provide a first plurality of error corrected data sub-blocks, using the error correction sub-blocks that may be related to the first plurality of data sub-blocks.

The method may include processing the first plurality of error corrected data sub-blocks during at least one operation out of an autonomous driving operation, a semi-autonomous driving operation and a driver assist technology operation.

The method may include initiating a human takeover of control of a vehicle, wherein the control may be handed from an autonomous control module of the vehicle.

The data sub-blocks may include segments of one or more images acquired by a radar.

The data sub-blocks may include segments of one or more images acquired by a LIDAR sensor.

The data sub-blocks may include segments of one or more camera images.

The data sub-blocks may include executable code.

There may be provided a system having error correction capabilities, the system may include a dynamic memory controller, a dynamic memory module that may be coupled to a communication link; a cache memory, and an error correction code unit; wherein the dynamic memory controller may be arranged to (a) open a selected row of a memory bank out of multiple memory banks of a dynamic memory module; and (b) receive, while the selected row may be open, selected data sub-blocks that may be targeted to be written to the selected row; wherein the dynamic memory module may be configured to receive the selected data sub-blocks from the dynamic memory controller and over a communication link; wherein the error correction unit may be arranged to calculate, while the selected row may be open, selected error correction code sub-blocks that may be related to the selected data sub-blocks; wherein the cache memory differs from the dynamic memory module and may be arranged to cache the selected error correction code sub-blocks; wherein the dynamic memory controller may be also arranged to (a) send the selected error correction code sub-blocks to the dynamic memory module over the communication link; (b) write, to the selected row and over the communication link, the selected error correction code sub-blocks while the selected row may be open; and (c) close the selected row.

The dynamic memory controller may include the error correction code unit and the cache memory.

The dynamic memory controller not include the error correction code unit and the cache memory.

The dynamic memory controller may be arranged to close the selected row by pre-charging the selected row.

The dynamic memory module may be arranged to store in the selected row more data sub-blocks that error correction code sub-blocks.

The dynamic memory module may be arranged to store in the selected row, data blocks and a single error correction code block; wherein each data block may include data sub-blocks, and wherein the single error correction code block may include error correction code sub-blocks.

The dynamic memory controller may be arranged to (a) open a new selected row of any memory bank of the multiple memory; (b) receive, while the new selected row may be open, new selected data sub-blocks that may be targeted to be written to the selected row; and (c) send the new selected data sub-blocks to the dynamic memory module over the communication link; wherein the error correction unit may be arranged to calculate, while the new selected row may be open, new selected error correction code sub-blocks that may be related to the new selected data sub-blocks; and wherein the dynamic memory controller may be also arranged to (a) write, to the new selected row over the communication link, the new selected error correction code sub-blocks while the new selected row may be open; and (b) close the new selected row.

The dynamic memory controller may be arranged to (a) receive a request for reading a first plurality of data sub-blocks blocks that may be stored at different memory bank of the multiple memory banks of the dynamic memory module; (b) check whether the cache memory stores error correction sub-blocks that may be related to any of the first plurality of data sub-blocks; (c) retrieve from the dynamic memory module the first plurality of data sub-blocks blocks; and (d) retrieve error correction sub-blocks that may be related to the first plurality of data sub-blocks; wherein the retrieve of the error correction sub-blocks may include retrieving from the cache memory, instead from the dynamic memory module, any error correction sub-block that may be stored in the cache memory and may be related to any of the first plurality of data sub-blocks; and wherein the error correction unit may be arranged to error correct the first plurality of data sub-blocks to provide a first plurality of error corrected data sub-blocks, using the error correction sub-blocks that may be related to the first plurality of data sub-blocks.

The processing unit may be arranged to process the first plurality of error corrected data sub-blocks during at least one operation out of an autonomous driving operation, a semi-autonomous driving operation and a driver assist technology.

The processing unit may be arranged to initiate a human takeover of control of a vehicle, wherein the control may be handed from an autonomous control module of the vehicle.

The data sub-blocks may include segments of one or more images acquired by a radar.

The data sub-blocks may include segments of one or more images acquired by the LIDAR sensor.

The data sub-blocks may include segments of one or more camera images.

The data sub-blocks may include executable code.

There may be provided a computer program product may store instructions that once executed by a computerized system may cause the computerized system to execute the steps of opening a selected row of a memory bank out of multiple memory banks of a dynamic memory module; receiving selected data sub-blocks, while the selected row may be open, by the dynamic memory module; wherein the selected data sub-blocks may be received over a communication link and may be targeted to be written to the selected row; calculating, while the selected row may be open and by an error correction unit, selected error correction code sub-blocks that may be related to the selected data sub-blocks; caching the selected error correction code sub-blocks in a cache memory that differs from the dynamic memory module; writing, to the selected row, the selected error correction code sub-blocks while the selected row may be open; wherein the writing may include sending the selected error correction code sub-blocks to the dynamic memory module over the communication link; and closing the selected row.

The closing of the selected row may include pre-charging the selected row.

The computer program product may store instructions for storing in the selected row more data sub-blocks that error correction code sub-blocks.

The computer program product may store instructions for storing, in the selected row, data blocks and a single error correction code block; wherein each data block may include data sub-blocks, and wherein the single error correction code block may include error correction code sub-blocks.

The computer program product may store instructions for opening a new selected row that belongs to any of the multiple memory banks; receiving by the dynamic memory module, over the communication link and while the new selected row may be open, new selected data sub-blocks that may be targeted to be written to the new selected row; calculating, by the error correction unit, while the new selected row may be open, new selected error correction code sub-blocks that may be related to the new selected data sub-blocks; caching the new selected error correction code sub-blocks in the cache memory; writing, to the new selected row, the new selected error correction code sub-blocks while the new selected row may be open; wherein the writing may include sending the new selected error correction code sub-blocks to the dynamic memory module over the communication link; and closing the new selected row.

The computer program product may store instructions for receiving a request for reading a first plurality of data sub-blocks blocks that may be stored at different memory bank of the multiple memory banks of the dynamic memory module; checking whether the cache memory stores error correction sub-blocks that may be related to any of the first plurality of data sub-blocks; retrieving from the dynamic memory module the first plurality of data sub-blocks blocks; retrieving error correction sub-blocks that may be related to the first plurality of data sub-blocks; wherein the retrieving may include retrieving from the cache memory, instead from the dynamic memory module, any error correction sub-block that may be stored in the cache memory and may be related to any of the first plurality of data sub-blocks; and error correcting the first plurality of data sub-blocks to provide a first plurality of error corrected data sub-blocks, using the error correction sub-blocks that may be related to the first plurality of data sub-blocks.

The computer program product may store instructions for processing the first plurality of error corrected data sub-blocks during at least one operation out of an autonomous driving operation, a semi-autonomous driving operation and a driver assist technology operation.

The computer program product may store instructions for initiating a human takeover of control of a vehicle, wherein the control may be handed from an autonomous control module of the vehicle.

The data sub-blocks may include segments of one or more images acquired by a radar.

The data sub-blocks may include segments of one or more images acquired by a LIDAR sensor.

The data sub-blocks may include segments of one or more camera images.

The data sub-blocks may include executable code.

Any reference to a system should be applied, mutatis mutandis to a method that is executed by a system and/or to a computer program product that stores instructions that once executed by the system will cause the system to execute the method. The computer program product is non-transitory and may be, for example, an integrated circuit, a magnetic memory, an optical memory, a disk, and the like.

Any reference to method should be applied, mutatis mutandis to a system that is configured to execute the method and/or to a computer program product that stores instructions that once executed by the system will cause the system to execute the method.

Any reference to a computer program product should be applied, mutatis mutandis to a method that is executed by a system and/or a system that is configured to execute the instructions stored in the computer program product.

The term "and/or" is additionally or alternatively.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

The phrase "may be X" indicates that condition X may be fulfilled. This phrase also suggests that condition X may not be fulfilled. For example—any reference to a system as including a certain component should also cover the scenario in which the system does not include the certain component.

The terms "including", "comprising", "having", "consisting" and "consisting essentially of" are used in an interchangeable manner. For example—any method may include at least the steps included in the figures and/or in the specification, only the steps included in the figures and/or the specification. The same applies to the system and the mobile computer.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as "computer systems."

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word "comprising" does not exclude the presence of other elements or steps then those listed in a claim. Furthermore, the terms "a" or "an," as used herein, are defined as one as or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements the mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

Any combination of any component of any component and/or unit of system that is illustrated in any of the figures and/or specification and/or the claims may be provided.

Any combination of any system illustrated in any of the figures and/or specification and/or the claims may be provided.

Any combination of steps, operations and/or methods illustrated in any of the figures and/or specification and/or the claims may be provided.

Any combination of operations illustrated in any of the figures and/or specification and/or the claims may be provided.

Any combination of methods illustrated in any of the figures and/or specification and/or the claims may be provided.

Moreover, while illustrative embodiments have been described herein, the scope of any and all embodiments having equivalent elements, modifications, omissions, combinations (e.g., of aspects across various embodiments), adaptations and/or alterations as would be appreciated by those skilled in the art based on the present disclosure. The limitations in the claims are to be interpreted broadly based on the language employed in the claims and not limited to examples described in the present specification or during the prosecution of the application. The examples are to be construed as non-exclusive. Furthermore, the steps of the disclosed methods may be modified in any manner, including by reordering steps and/or inserting or deleting steps. It is intended, therefore, that the specification and examples be considered as illustrative only, with a true scope and spirit being indicated by the following claims and their full scope of equivalents.

What is claimed is:

1. A system having error correction capabilities, the system comprising:
    a dynamic memory controller;
    a dynamic memory module that is coupled to a communication link;
    a cache memory; and
    an error correction code unit;
    wherein the dynamic memory controller is arranged to (a) open a selected row of a memory bank out of multiple memory banks of a dynamic memory module; and
    (b) receive, while the selected row is open, selected data sub-blocks that are targeted to be written to the selected row, wherein the dynamic memory module is configured to receive the selected data sub-blocks from the dynamic memory controller and over a communication link;
    wherein the error correction unit is arranged to calculate, while the selected row is open, selected error correction code sub-blocks that are related to the selected data sub-blocks, wherein the cache memory differs from the dynamic memory module and is arranged to cache the selected error correction code sub-blocks;
    wherein the dynamic memory controller is also arranged to (a) send the selected error correction code sub-blocks to the dynamic memory module over the communication link; (b) write, to the selected row and over the communication link, the selected error correction code sub-blocks while the selected row is open; and (c) close the selected row;
    wherein the dynamic memory controller is arranged to (a) open a new selected row of any memory bank of the multiple memory; (b) receive, while the new selected row is open, new selected data sub-blocks that are targeted to be written to the selected row; and (c) send the new selected data sub-blocks to the dynamic memory module over the communication link;
    wherein the error correction unit is arranged to calculate, while the new selected row is open, new selected error correction code sub-blocks that are related to the new selected data sub-blocks; and
    wherein the dynamic memory controller is also arranged to (a) write, to the new selected row over the communication link, the new selected error correction code sub-blocks while the new selected row is open; and (b) close the new selected row.

2. The system according to claim 1, wherein the dynamic memory controller comprises the error correction code unit and the cache memory.

3. The system according to claim 1, wherein the dynamic memory controller is arranged to close the selected row by pre-charging the selected row.

4. The system according to claim 1, wherein the dynamic memory module is arranged to store in the selected row more data sub-blocks that error correction code sub-blocks.

5. The system according to claim 1, wherein the dynamic memory module is arranged to store in the selected row, data blocks and a single error correction code block, wherein each data block comprises data sub-blocks, and wherein the single error correction code block comprises error correction code sub-blocks.

6. The system according to claim 1, wherein the data sub-blocks comprise segments of one or more images acquired by a radar.

7. The system according to claim 1, wherein the data sub-blocks comprise segments of one or more images acquired by the LIDAR sensor.

8. The system according to claim 1, wherein the data sub-blocks comprise segments of one or more camera images.

9. The system according to claim 1, wherein the data sub-blocks comprise executable code.

10. A system having error correction capabilities, the system comprising:
    a dynamic memory controller;
    a dynamic memory module that is coupled to a communication link;
    a cache memory; and
    an error correction code unit;
    wherein the dynamic memory controller is arranged to (a) open a selected row of a memory bank out of multiple memory banks of a dynamic memory module; and
    (b) receive, while the selected row is open, selected data sub-blocks that are targeted to be written to the selected row, wherein the dynamic memory module is configured to receive the selected data sub-blocks from the dynamic memory controller and over a communication link;

wherein the error correction unit is arranged to calculate, while the selected row is open, selected error correction code sub-blocks that are related to the selected data sub-blocks, wherein the cache memory differs from the dynamic memory module and is arranged to cache the selected error correction code sub-blocks;

wherein the dynamic memory controller is also arranged to (a) send the selected error correction code sub-blocks to the dynamic memory module over the communication link; (b) write, to the selected row and over the communication link, the selected error correction code sub-blocks while the selected row is open; and (c) close the selected row;

wherein the dynamic memory controller is arranged to (a) receive a request for reading a first plurality of data sub-blocks blocks that are stored at different memory bank of the multiple memory banks of the dynamic memory module; (b) check whether the cache memory stores error correction sub-blocks that are related to any of the first plurality of data sub-blocks; (c) retrieve from the dynamic memory module the first plurality of data sub-blocks blocks; and (d) retrieve error correction sub-blocks that are related to the first plurality of data sub-blocks;

wherein a retrieval of the error correction sub-blocks comprises retrieving from the cache memory, instead from the dynamic memory module, any error correction sub-block that is stored in the cache memory and is related to any of the first plurality of data sub-blocks; and wherein the error correction unit is arranged to error correct the first plurality of data sub-blocks to provide a first plurality of error corrected data sub-blocks, using the error correction sub-blocks that are related to the first plurality of data sub-blocks.

11. The system according to claim 10, wherein the processing unit is arranged to process the first plurality of error corrected data sub-blocks during at least one operation out of an autonomous driving operation, a semi-autonomous driving operation and a driver assist technology.

12. The system according to claim 10, wherein the processing unit is arranged to initiate a human takeover of control of a vehicle, wherein the control is handed from an autonomous control module of the vehicle.

13. A method for accessing a dynamic memory module, the method comprising:
opening a first selected row of a first memory bank that belongs to a first group of memory banks of a dynamic memory module;
opening a second selected row of a second memory bank that belongs to a second group of memory banks of the dynamic memory module;
receiving first selected data sub-blocks, while the first selected row is open, by the dynamic memory module, wherein the first selected data sub-blocks are received over a communication link and are targeted to be written to the first selected row;
receiving second selected data sub-blocks, while the second selected row is open, by the dynamic memory module, wherein the second selected data sub-blocks are received over the communication link and are targeted to be written to the second selected row;
calculating, while the second selected row is open and by an error correction unit, first selected error correction code sub-blocks that are related to the first selected data sub-blocks;

caching the first selected error correction code sub-blocks in a cache memory that differs from the dynamic memory module;
calculating, while the first selected row is open and by an error correction unit, second selected error correction code sub-blocks that are related to the second selected data sub-blocks;
caching the second selected error correction code sub-blocks in the cache memory that differs from the dynamic memory module;
writing, to the first selected row, the second selected error correction code sub-blocks while the first selected row is open, wherein the writing comprises sending the second selected error correction code sub-blocks to the dynamic memory module over the communication link;
writing, to the second selected row, the first selected error correction code sub-blocks while the second selected row is open, wherein the writing comprises sending the second selected error correction code sub-blocks to the dynamic memory module over the communication link; and
closing the first and second selected rows.

14. The method according to claim 13, wherein the writing of the second selected error correction code sub-blocks and the writing of the first selected error correction code are executed in an interleaved manner.

15. The method according to claim 13, comprising writing, in an interleaved manner, (a) the first selected data sub-blocks and the second selected error collection code sub-blocks to the first selected row, and (b) the second selected data sub-blocks and the first selected error collection code sub-blocks to the second selected row.

16. The method according to claim 13, wherein the closing of the first and second selected rows comprises pre-charging the first and second selected rows.

17. The method according to claim 13, comprising storing in each one of the first and second selected rows more data sub-blocks than error correction code sub-blocks.

18. The method according to claim 13, comprising storing, in the first selected row, first data blocks and a single second error correction code block, wherein each first data block comprises first data sub-blocks, and wherein the single second error correction code block comprises second error correction code sub-blocks.

19. The method according to claim 13, comprising:
opening a new first selected row that belongs to the first group of memory banks;
opening a new second selected row that belongs to the second group of memory banks;
receiving by the dynamic memory module, over the communication link and while the new first selected row is open, new first selected data sub-blocks that are targeted to be written to the new first selected row;
receiving by the dynamic memory module, over the communication link and while the new second selected row is open, new second selected data sub-blocks that are targeted to be written to the new second selected row;
calculating, by the error correction unit, while the new second selected row is open, new first selected error correction code sub-blocks that are related to the new first selected data sub-blocks;
calculating, by the error correction unit, while the new first selected row is open, new second selected error correction code sub-blocks that are related to the new second selected data sub-blocks;
caching the new first selected error correction code sub-blocks in the cache memory;

caching the new second selected error correction code sub-blocks in the cache memory;

writing, to the new second selected row, the new first selected error correction code sub-blocks while the new second selected row is open, wherein the writing comprises sending the new first selected error correction code sub-blocks to the dynamic memory module over the communication link;

writing, to the new first selected row, the new second selected error correction code sub-blocks while the new first selected row is open, wherein the writing comprises sending the new second selected error correction code sub-blocks to the dynamic memory module over the communication link; and closing the new first selected row and the new second selected row.

20. A non-transitory computer program product that stores instructions that once executed by a computerized system may cause the computerized system to execute the steps of:

opening a selected row of a memory bank out of multiple memory banks of a dynamic memory module;

receiving selected data sub-blocks, while the selected row is open, by the dynamic memory module, wherein the selected data sub-blocks are received over a communication link and are targeted to be written to the selected row;

calculating, while the selected row is open and by an error correction unit, selected error correction code sub-blocks that are related to the selected data sub-blocks;

caching the selected error correction code sub-blocks in a cache memory that differs from the dynamic memory module;

writing, to the selected row, the selected error correction code sub-blocks while the selected row is open, wherein the writing comprises sending the selected error correction code sub-blocks to the dynamic memory module over the communication link;

closing the selected row;

opening a new selected row that belongs to any of the multiple memory banks;

receiving by the dynamic memory module, over the communication link and while the new selected row is open, new selected data sub-blocks that are targeted to be written to the new selected row;

calculating, by the error correction unit, while the new selected row is open, new selected error correction code sub-blocks that are related to the new selected data sub-blocks;

caching the new selected error correction code sub-blocks in the cache memory;

writing, to the new selected row, the new selected error correction code sub-blocks while the new selected row is open, wherein the writing comprises sending the new selected error correction code sub-blocks to the dynamic memory module over the communication link; and closing the new selected row.

21. The non-transitory computer program product according to claim 20, that stores instructions for closing the selected row by pre-charging the selected row.

22. The non-transitory computer program product according to claim 20, that stores instructions for storing in the selected row more data sub-blocks that error correction code sub-blocks.

23. The non-transitory computer program product according to claim 20, that stores instructions for storing in the selected row, data blocks and a single error correction code block, wherein each data block comprises data sub-blocks, and wherein the single error correction code block comprises error correction code sub-blocks.

24. The non-transitory computer program product according to claim 20, wherein the data sub-blocks comprise segments of one or more images acquired by a radar.

25. The non-transitory computer program product according to claim 20, wherein the data sub-blocks comprise segments of one or more images acquired by the LIDAR sensor.

26. The non-transitory computer program product according to claim 20, wherein the data sub-blocks comprise segments of one or more camera images.

27. The non-transitory computer program product according to claim 20, wherein the data sub-blocks comprise executable code.

28. A non-transitory computer program product that stores instructions that once executed by a computerized system may cause the computerized system to execute the steps of:

opening a selected row of a memory bank out of multiple memory banks of a dynamic memory module;

receiving selected data sub-blocks, while the selected row is open, by the dynamic memory module, wherein the selected data sub-blocks are received over a communication link and are targeted to be written to the selected row;

calculating, while the selected row is open and by an error correction unit, selected error correction code sub-blocks that are related to the selected data sub-blocks;

caching the selected error correction code sub-blocks in a cache memory that differs from the dynamic memory module;

writing, to the selected row, the selected error correction code sub-blocks while the selected row is open, wherein the writing comprises sending the selected error correction code sub-blocks to the dynamic memory module over the communication link;

closing the selected row;

receiving a request for reading a first plurality of data sub-blocks blocks that are stored at different memory bank of the multiple memory banks of the dynamic memory module;

checking whether the cache memory stores error correction sub-blocks that are related to any of the first plurality of data sub-blocks;

retrieving from the dynamic memory module the first plurality of data sub-blocks blocks;

retrieving error correction sub-blocks that are related to the first plurality of data sub-blocks, wherein the retrieving comprises retrieving from the cache memory, instead from the dynamic memory module, any error correction sub-block that is stored in the cache memory and is related to any of the first plurality of data sub-blocks; and error correcting the first plurality of data sub-blocks to provide a first plurality of error corrected data sub-blocks, using the error correction sub-blocks that are related to the first plurality of data sub-blocks.

29. The non-transitory computer program product according to claim 28, wherein the writing of the second selected error correction code sub-blocks and the writing of the first selected error correction code are executed in an interleaved manner.

30. The non-transitory computer program product according to claim 28, that stores instructions for writing, in an interleaved manner, (a) the first selected data sub-blocks and the second selected error collection code sub-blocks to the first selected row, and (b) the second selected data sub-blocks and the first selected error collection code sub-blocks to the second selected row.

31. The non-transitory computer program product according to claim 28, wherein the closing of the first and second selected rows comprises pre-charging the first and second selected rows.

32. The non-transitory computer program product according to claim 28, that stores instructions for storing in each one of the first and second selected rows more data sub-blocks than error correction code sub-blocks.

33. The non-transitory computer program product according to claim 28, that stores instructions for storing, in the first selected row, first data blocks and a single second error correction code block, wherein each first data block comprises first data sub-blocks, and wherein the single second error correction code block comprises second error correction code sub-blocks.

34. The non-transitory computer program product according to claim 28, that stores instructions for:
- opening a new first selected row that belongs to the first group of memory banks;
- opening a new second selected row that belongs to the second group of memory banks;
- receiving by the dynamic memory module, over the communication link and while the new first selected row is open, new first selected data sub-blocks that are targeted to be written to the new first selected row;
- receiving by the dynamic memory module, over the communication link and while the new second selected row is open, new second selected data sub-blocks that are targeted to be written to the new second selected row;
- calculating, by the error correction unit, while the new second selected row is open, new first selected error correction code sub-blocks that are related to the new first selected data sub-blocks;
- calculating, by the error correction unit, while the new first selected row is open, new second selected error correction code sub-blocks that are related to the new second selected data sub-blocks;
- caching the new first selected error correction code sub-blocks in the cache memory;
- caching the new second selected error correction code sub-blocks in the cache memory;
- writing, to the new second selected row, the new first selected error correction code sub-blocks while the new second selected row is open, wherein the writing comprises sending the new first selected error correction code sub-blocks to the dynamic memory module over the communication link;
- writing, to the new first selected row, the new second selected error correction code sub-blocks while the new first selected row is open, wherein the writing comprises sending the new second selected error correction code sub-blocks to the dynamic memory module over the communication link; and
- closing the new first selected row and the new second selected row.

* * * * *